United States Patent
Ohtsu et al.

[11] Patent Number: 6,083,266
[45] Date of Patent: Jul. 4, 2000

[54] SIMULATION APPARATUS AND SIMULATION METHOD USING MOMENT METHOD

[75] Inventors: Shinichi Ohtsu; Makoto Mukai, both of Kawasaki, Japan

[73] Assignee: Fujitsu Limited, Kawasaki, Japan

[21] Appl. No.: 09/013,071

[22] Filed: Jan. 26, 1998

[30] Foreign Application Priority Data

Jun. 26, 1997 [JP] Japan .................................. 9-170119

[51] Int. Cl.⁷ .................................................. G06F 17/10
[52] U.S. Cl. .................................... 703/2; 703/3; 703/4
[58] Field of Search ........................ 395/500.35, 500.34, 395/500.26

[56] References Cited

U.S. PATENT DOCUMENTS

| | | | |
|---|---|---|---|
| 5,650,935 | 7/1997 | Nishino et al. | 702/57 |
| 5,745,370 | 4/1998 | Ohtsu et al. | 395/500.04 |
| 5,812,434 | 9/1998 | Nagase et al. | 364/578 |
| 5,815,414 | 9/1998 | Funaki et al. | 395/500.42 |
| 5,903,477 | 5/1999 | Otsu et al. | 395/500.27 |

FOREIGN PATENT DOCUMENTS 7-302278  11/1995  Japan .

OTHER PUBLICATIONS

Mark Tilston and Keith Balmain, Oct. 1990, 'A multiradius, reciprocal implementation of the Thin–wire moment method', I EEE Transactiona on Antenna and Propagation, vol. 38 No. 10, pp. 1636–1644.

Mark Tilston and Keith Balmain, Feb. 1990, 'On the suppression of asymmetric artificats arising in an implementation of the thin–wire method of moments', IEEE vol. 38, No. 2, pp. 281–285.

*Primary Examiner*—Kevin J. Teska
*Assistant Examiner*—Lonnie A. Knox
*Attorney, Agent, or Firm*—Staas & Halsey LLP

[57] ABSTRACT

A simulation apparatus for simulating the current flowing through elements of an electronic apparatus using the moment method based on reaction matching and able to achieve high speed simulation processing, comprising a segmenting means for segmenting the electronic apparatus to be analyzed into elements, a calculating means for calculating a mutual impedance between segmented elements of the electronic apparatus, assuming that a triangle function current flows through the monopoles, by using an approximation equation of the mutual impedance between monopoles, expressed by a polynomial of the power of k, derived by $\exp(-jkr)$ which is approximated by multiplication of $\exp(-jkr_0)$ and a Taylor expansion of $\exp[-jk(r-r_0)]$ (where j is an imaginary number, k is a wave number, r is the distance between monopoles, and $r_0$ is a representative distance between monopoles), and a simulating means, by using the calculated mutual impedances between elements, for finding the current flowing through the elements of the electronic apparatus in accordance with the moment method.

17 Claims, 9 Drawing Sheets

A ↔ C : MUTUAL IMPEDANCE $Z_{11}$
B ↔ D : MUTUAL IMPEDANCE $Z_{00}$
B ↔ C : MUTUAL IMPEDANCE $Z_{01}$
A ↔ D : MUTUAL IMPEDANCE $Z_{10}$ $$Z = j\omega \int_S [\frac{\mu}{4\pi} J_1 J_2 \cos\phi \frac{e^{-jkr}}{r} + \frac{1}{4\pi\varepsilon} \rho_1 \rho_2 \frac{e^{-jkr}}{r}] ds$$

SIMULATION APPARATUS AND SIMULATION METHOD USING MOMENT METHOD

BACKGROUND OF THE INVENTION

1. Field of the Invention

The present invention relates to a simulation apparatus, and corresponding method, for simulating the current flowing through elements of an electronic apparatus using the moment method and to a memory medium for storing programs for realizing the simulation apparatus and corresponding method and, more particularly, relates to a simulation apparatus and corresponding method using the moment method for executing simulation processing at a high speed and a memory medium for storing programs for realizing that the simulation apparatus and corresponding method.

Electronic apparatuses are also restricted by society from being affected by radio waves or noise radiated from other electronic apparatuses, which level is more than a certain level. Countries are also establishing tough regulations in this regard. To simulate quantitatively the radio waves generated by electronic apparatuses, it is necessary to calculate not only the radio waves generated by the printed circuit boards, but also the radio waves radiated due to the common mode current flowing through the cables and the shield effect of the housings etc.

Due to this, the present inventors have previously proposed a simulation technique using the moment method which calculates the current flowing through the elements of an electronic apparatus and uses that to calculate the radio waves radiating from the electronic apparatus. To make such a simulation technique practical, it is necessary to construct a configuration for realizing processing at a much higher speed (for example, see Japanese Unexamined Patent Publication (Kokai) No. 7-302278).

2. Description of the Related Art

The intensity of an electromagnetic field radiating from an object may be simulated by finding the electric current and the magnetic current flowing through parts of the object and then substituting the current into a known theoretical equation of the radiation of electromagnetic waves. The electric current and magnetic current flowing through the parts of the object theoretically can be obtained by solving Maxwell's electromagnetic wave equations under given boundary conditions.

One way to solve this is the moment method. The moment method is a method of solving integration equations derived from Maxwell's electromagnetic wave equations. It segments an object into small elements for which the electric current and magnetic current are then calculated. This makes it possible to handle any three-dimensionally shaped objects. A reference document on this moment method is "N. N. Wang, J. H. Richmond, and M. C. Gilreath: "Sinusoidal reaction formulation for radiation and scattering from conducting surface", IEEE Transactions Antennas Propagation, Vol. AP-23, 1975".

In the moment method, the configuration of the electronic apparatus to be simulated is segmented into elements. When the frequency to be processed is selected, the mutual impedance between segmented elements for that frequency is found by predetermined computation (when the mutual admittance and the mutual reaction are considered, found for these as well), the found mutual impedance and wave source specified by the configuration information are entered into the simultaneous equations of the moment method, and the equations are solved to find the electric current flowing through the elements (magnetic current as well when considering the mutual admittance and mutual reaction).

That is, the mutual impedance $Z_{ij}$ between segmented elements is found and the simultaneous equations of the moment method standing between the mutual impedance $Z_{ij}$, the wave source $V_j$, and the electric current $I_i$ flowing through the segmented elements $$[Z_{ij}][I_i]=[V_i]$$

are solved to find the current Ii flowing through the segmented elements.

The related art regarding the derivation of the mutual impedance will be explained later in detail with reference to the drawings and equations.

The related art has the following advantages: That is, as clear from the equation of the mutual impedance between monopoles, "$Z_{ij}=Z_{ji}$" stands. From this, it is clear that the simultaneous equations of the moment method are symmetrical in form. Due to this, the number of the impedances to be calculated is reduced and the simultaneous equations can be calculated faster.

Further, the expansion function is a sinusoidal function and uses reaction matching (integration over an entire range on each monopole and, therefore, it becomes a double integration even in the case of a wire), so even if the number of the unknowns (number of segmented elements) is small, high precision calculation becomes possible. As opposed to this, if the expansion function is a pulse function and uses point matching (calculation of just one point for one monopole, therefore, the required integration becomes a single integration), a larger number of unknowns becomes necessary to achieve precision.

The time for solving simultaneous equations under the moment method is proportional to the cube of the unknowns, so if the expansion function is a sinusoidal function and reaction matching is adopted, a small number of unknowns is enough—which is very advantageous for analyzing large scale models.

The mutual impedances $Z_{13}$, $Z_{14}$, $Z_{23}$, and $Z_{24}$ between the above mentioned monopoles, however, cannot be calculated by elementary functions.

Due to this, in the related art, the method was adopted of expanding the mutual impedances between monopoles into a plurality of exponential integrals and calculating these exponential integrals by a numerical calculation scheme defined by formulas so as to calculate the mutual impedances between monopoles. Here, when the two monopoles are parallel (cos $\phi=1$), there are eight exponential integrals expanded and when the two monopoles cross each other (cos $\phi\neq1$), there are 20.

Note that the numerical calculation scheme of the exponential integrals consists mainly of repetitive calculations, so time is taken even for calculation of one exponential integral. When the two monopoles are parallel, it takes eight times that time, while when the two monopoles cross (in this case, the range of integration becoming a complex number), it takes 20 times that time and therefore an extremely long time is required for the calculations.

Further, for the impedance between surface patches, a further long time is required for the calculation since the impedance is obtained by double integration of impedance between wires forming the surface patch.

Due to this, if, according to the related art, the moment method is used to simulate the electric current flowing through the elements of an electronic apparatus, there is the problem that an extremely long time is required for the processing.

Explaining the related art in more detail in accordance with the equation:

$$Z_{13} = [j\omega\mu/(4\pi \sin kd_1 \sin kd_3)] \times$$
$$\int\int [\sin k(z-z_0)\sin k(t-t_0)\cos\phi - \cos k(z-z_0)\cos k(t-t_0)] \times$$
$$\exp(-jkr)/r \cdot dzdt$$

where, $\int\int$ denotes integrals from $t_0$ to $t_1$ and from $z_0$ to $z_1$ when the two monopoles are parallel (cos $\phi=1$), by expanding this equation into eight exponential integrals, the following is obtained:

$$Z_{13} = [j\omega\mu/(4\pi \sin kd_1 \sin kd_3)] \times \left[\sum \alpha_n \int \exp(-jku)/u \cdot du\right]$$

where, $\alpha_n$ is a constant of a complex number, $\sum$ is the sum for $n = 1$ to 8, and $\int$ is the integral from $a_{0n}$ (real number)

to $a_{1n}$ (real number).

Further, when the two monopoles cross (cos $\phi\approx1$), by expanding the above equation of $Z_{13}$ into 20 exponential integrals, the following is obtained:

$$Z_{13} = [j\omega\mu/(4\pi\sin kd_1 \sin kd_3)] \times \Bigg[$$
$$\sum \alpha_n \int \exp(-jku)/u \cdot du + \sum \beta_n \int \exp(-jku)/u \cdot du\Bigg]$$

where, $\alpha_n$ and $\beta_n$ are constants of complex numbers,
the $\Sigma$ of the first term is the sum for n=1 to 4,
the $\Sigma$ of the second term is the sum for n=1 to 16,
the $\int$ of the first term is the integral from $a_{0n}$ (real number) to $a_{1n}$ (real number), and
the $\int$ of the second term is the integral from $c_{0n}$ (complex number) to $c_{1n}$ (complex number).

Further, by substituting "jku" into "t", these exponential integrals "$\int\exp(-jku)/u\cdot du$" are modified to $$\int_{c0n}^{c1n} \exp(-jkr)/u \cdot du = \int_{jkc0n}^{jkc1n} \exp(-t)/t \cdot dt$$
$$= \int^{jkc1n} \exp(-t)/t \cdot dt - \int^{jkc0n} \exp(-t)/t \cdot dt$$

where, $\int^{jkc1n}$ is the integral from $\infty$ to $jkc_{1n}$ and
$\int^{jkc0n}$ is the integral from $\infty$ to $jkc_{0n}$ Further, the terms are calculated repeatedly in accordance with the following formula until the necessary precision is obtained:

$$\int \exp(-t)t \cdot dt = \gamma + \log t + \Sigma[(-1)^n t^n/(n!n)]$$

where, $\int$ is the integral from $\infty$ to a specified value,
$\gamma$ is Euler's constant, and
$\Sigma$ is the sum from n=1 to $\infty$.

Normally, the calculation is repeated about n=10 to 20 times.

If following the related art in this way, there is the problem that an extremely long time is required for calculation of the mutual impedance between monopoles. Due to this, when using the moment method to simulate the electric current flowing through elements of an electronic apparatus, there is the problem that an extremely long time is required for the processing.

SUMMARY OF THE INVENTION

Therefore, the present invention was made in consideration of the above circumstances and has as its object the provision of a new simulation apparatus and method using the moment method which enables high speed processing for simulation when adopting a configuration to simulate the electric current flowing through elements of an electronic apparatus and the provision of a new memory medium for storing programs for realizing this simulation apparatus.

To attain the above object, the present invention is comprised of a means for segmenting an electronic apparatus to be analyzed into elements; a means for calculating a mutual impedance between segmented elements of the electronic apparatus, assuming that a triangle function current flows through the monopoles, by using an approximation equation of the mutual impedance between monopoles, expressed by a polynomial of the power of k, derived by exp(–jkr) which is approximated by multiplication of exp(–jkr$_0$) and a Taylor expansion of exp[–jk(r–r$_0$)] (where j is an imaginary number, k is a wave number, r is the distance between monopoles, and r$_0$ is a representative distance between monopoles), and a means for finding the current flowing through segmented elements of the electronic apparatus in accordance with the moment method, by using the calculated mutual impedance between segmented elements. By this, the present invention makes it possible for the simulation apparatus simulating the electric current flowing through elements of the electronic apparatus using the moment method to perform the processing for the simulation at a high speed.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Before describing the embodiments of the present invention, the related art and the disadvantages therein will be described with reference to the related figures.

Figures 8, 9:
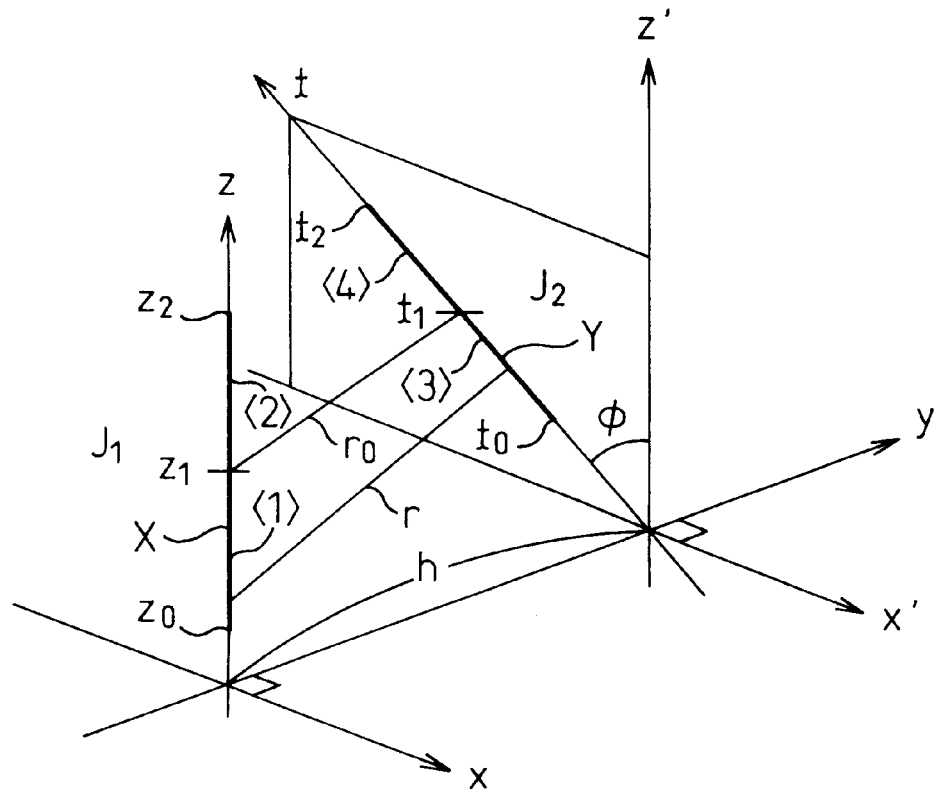
FIG. 8 is a view explaining the mutual impedance.
FIG. 9 is a view of the expression of the mutual impedance by a numerical equation.

FIG. 8 is a view explaining the mutual impedance.

As explained above, in the moment method, the configuration of an electronic apparatus to be simulated is segmented into elements. When the frequency to be processed is selected, the mutual impedance between segmented elements for that frequency is found by predetermined computation (when the mutual admittance and the mutual reaction are considered, found for these as well), the found mutual impedance and the wave source, which is specified by the configuration information are entered into the simultaneous equations of the moment method, and the equations are solved to find the electric current flowing through the elements (magnetic current as well when considering the mutual admittance and mutual reaction).

That is, the mutual impedance $Z_{ij}$ between segmented elements is found and the simultaneous equations of the moment method standing between the mutual impedance $Z_{ij}$, the wave source $V_i$, and the electric current $I_i$ flowing through the segmented elements $$[Z_{ij}][I_i]=[V_i]$$

are solved to find the current $I_i$ flowing through the segmented elements.

The mutual impedance $Z_{ij}$ between elements necessary in the moment method is derived using monopoles.

For the purpose of explanation of the mutual impedance $Z_{ij}$, consider the monopoles shown in FIG. 8. In the figure, the bold lines show monopoles. The monopole <1> and the monopole <2> are disposed on a single straight line, while the monopole <3> and the monopole <4> are disposed on another single straight line. Assume that the distance between the monopoles (<1> and <2>) and the monopoles (<3> and <4>) is h and then the angle formed between the monopoles (<1> and <2>) and the monopoles (<3> and <4>) is $\phi$.

At this time, the following relation stands among any position z on the monopoles <1> and <2>, any position t on the monopoles <3> and <4>, the distance h between the monopoles <1> and <2> and the monopoles <3> and <4>, and the angle $\phi$ formed between the monopoles <1> and <2> and the monopoles <3> and <4>:

$$r=(z^2+t^2-2zt \cos \phi+h^2)^{1/2}$$

FIG. 9 is a view of the expression of the mutual impedance by a numerical equation.

The general equation for the mutual impedance $Z_{ij}$ is expressed by the numerical equation shown in FIG. 9. Here, $\omega$ is the angular frequency, r is the distance between monopoles, $\rho_1=(-1/j\omega)\times(\partial J_1/\partial t)$ and $\rho_2=(-1/j\omega)\times(\partial J_2/\partial t)$. Further, s is used as the range of the integration because consideration is given not only to the case where the monopole is shaped linearly (wire), but also in the case where the monopole is shaped as a plane (surface patch).

$J_1$ and $J_2$ are expansion functions by the moment method and show the envelop of the current flowing on the monopoles.

In the related art, as the expansion functions, piecewise-sinusoidal function currents are used to calculate the mutual impedance $Z_{ij}$.

That is, in the related art, the expansion functions for the monopoles <1> to <4> are assumed to be as follows:

Current monopole <1> $J_1=\sin k(z-z_0)/\sin kd_1$
Current monopole <2> $J_1=\sin k(z_2-z)/\sin kd_2$
Current monopole <3> $J_2=\sin k(t-t_0)/\sin kd_3$
Current monopole <4> $J_2=\sin k(t_2-t)/\sin kd_4$ where, k: wave number
$d_1$: length of monopole <1>
$d_2$: length of monopole <2>
$d_3$: length of monopole <3>
$d_4$: length of monopole <4>

From this, these expansion functions may be used to find the mutual impedance $Z_{13}$ between the monopole <1> and the monopole <3>, the mutual impedance $Z_{14}$ between the monopole <1> and the monopole <4>, the mutual impedance $Z_{23}$ between the monopole <2> and the monopole <3>, and the mutual impedance $Z_{24}$ between the monopole <2> and the monopole <4> as follows:

$$Z_{13} = [j\omega\mu/(4\pi \sin kd_1 \sin kd_3)] \times$$
$$\int\int [\sin k(z-z_0)\sin k(t-t_0)\cos\phi - \cos k(z-z_0)\cos k(t-t_0)] \times$$
$$\exp(-jkr)/r \cdot dzdt$$

where $\int\int$ denotes the integrals from $t_0$ to $t_1$ and from $z_0$ to $z_1$ $$Z_{14} = [j\omega\mu/(4\pi \sin kd_1 \sin kd_4)] \times$$
$$\int\int [\sin k(z-z_0)\sin k(t_2-t)\cos\phi + \cos k(z-z_0)\cos k(t_2-t)] \times$$
$$\exp(-jkr)/r \cdot dzdt$$

where $\int\int$ denotes the integrals from $t_1$ to $t_2$ and from $z_0$ to $z_1$ $$Z_{23} = [j\omega\mu/(4\pi \sin kd_2 \sin kd_3)] \times$$
$$\int\int [\sin k(z_2-z)\sin k(t-t_0)\cos\phi - \cos k(z_2-z)\cos k(t-t_0)] \times$$
$$\exp(-jkr)/r \cdot dzdt$$

where $\int\int$ denotes the integrals from $t_0$ to $t_1$ and from $z_1$ to $z_2$ $$Z_{24} = [j\omega\mu/(4\pi \sin kd_2 \sin kd_4)] \times$$
$$\int\int [\sin k(z_2-z)\sin k(t_2-t)\cos\phi - \cos k(z_2-z)\cos k(t_2-t)] \times$$
$$\exp(-jkr)/r \cdot dzdt$$

where $\int\int$ denotes the integrals from $t_1$ to $t_2$ and from $z_1$ to $z_2$ These mutual impedances between monopoles may be used to find the mutual impedance $Z_W$ between wires as follows:

$$Z_W=Z_{13}+Z_{14}+Z_{23}+Z_{24}$$

Figure 10:
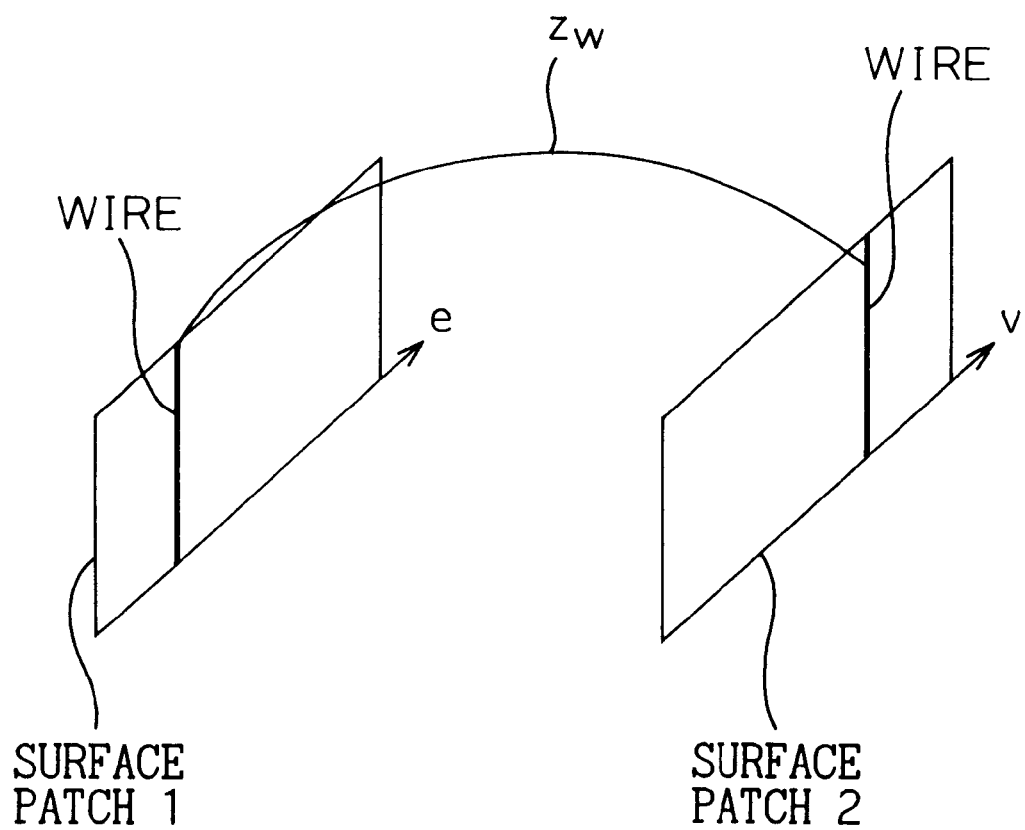
FIG. 10 is a view explaining the mutual impedance.

FIG. 10 is a view explaining the mutual impedance. Further, the mutual impedance $Z_S$ between surface patches may be found, as shown in FIG. 10, by performing double integration on the mutual impedance $Z_W$ between wires.

The related art has various advantages as described above.

However, the above-mentioned mutual impedances $Z_{13}$, $Z_{14}$, $Z_{23}$, and $Z_{24}$ between monopoles cannot be calculated by elementary functions.

Therefore, when following the related art, as explained in detail above, there is the problem that an extremely long time is required for calculation of the mutual impedance between monopoles. As a result, when using the moment method to simulate the electric current flowing through elements of an electronic apparatus, there is the problem that an extremely long time is required for the processing.

Therefore, the present invention provides a new simulation apparatus and method using the moment method which enables high speed processing for the simulation of the electric current flowing through the segmented elements of an electronic apparatus and provides a new memory medium for storing programs for realizing this simulation apparatus.

Figure 1:
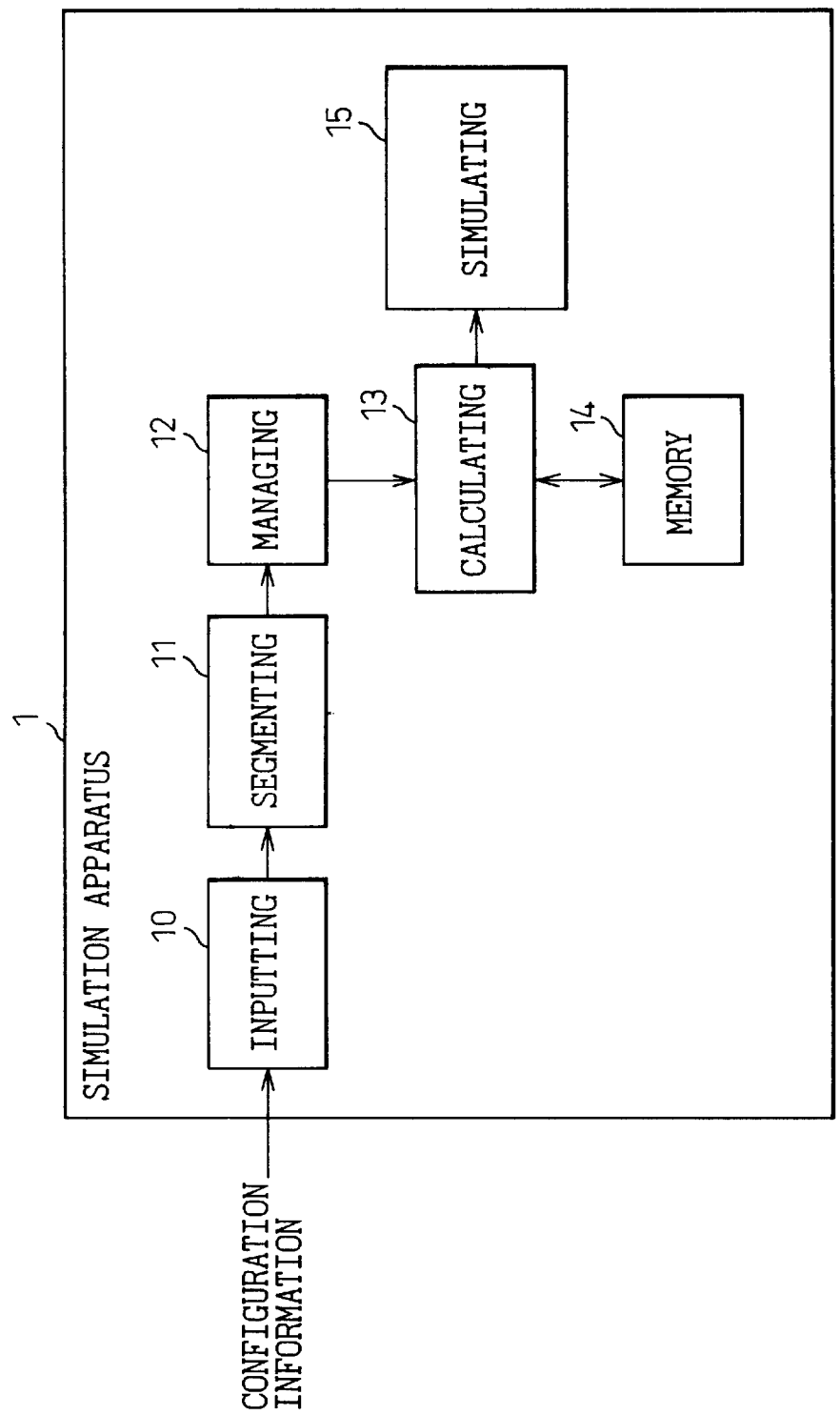
FIG. 1 is a view of the basic configuration of the present invention.

FIG. 1 illustrates the basic configuration of the present invention.

In the figure, reference numeral 1 is a simulation apparatus embodying the present invention. This apparatus segments an electronic apparatus into elements and, when a frequency is given, calculates the mutual impedances between elements and simulates the electric current flowing through the elements from these mutual impedances and the wave sources of the elements by the moment method using reaction matching.

The simulation apparatus 1 of the present invention is comprised of an inputting means 10, a segmenting means 11, a managing means 12, a calculating means 13, a memory means 14, and a simulating means 15.

The inputting means 10 inputs the configuration information of the electronic apparatus to be analyzed. The segmenting means 11 segments the electronic apparatus to be analyzed into elements in accordance with the configuration information input by the inputting means 10. The managing means 12 temporarily holds the segment information output by the segmenting means 11.

The calculating means 13 calculates the mutual impedance between elements, segmented by the segmenting means 11, of the electronic apparatus, assuming that a triangle waveform current flows through the monopoles, by using an approximation equation of the mutual impedance between monopoles, expressed by a polynomial of the power of k, derived by $\exp(-jkr)$ which is approximated by multiplication of $\exp(-jkr_0)$ and a Taylor expansion of $\exp[-jk(r-r_0)]$. Here, j is an imaginary number, k is a wave number, r is any distance between monopoles, and $r_0$ is a representative distance between monopoles.

The calculating means 13 is provided separately with a first calculation routine used when the two monopoles are parallel, a second calculation routine used when the two monopoles are perpendicular to each other, and a third calculation routine used when the two monopoles are not parallel and not perpendicular. It can use one calculation routine, in accordance with the angle formed by the two monopoles, out of the first to third calculation routines to calculate the mutual impedance between elements.

Further, the calculating means 13 is provided with a plurality of calculation routines having different expansion levels of the Taylor expansion of $\exp[-jk(r-r_0)]$. It can use one calculation routine, in accordance with the length of the monopoles, out of these plurality of calculation routines to calculate the mutual impedance between elements.

The memory means 14 stores the coefficient values, for the wires, calculated by the calculating means 13, that is, the coefficient values of the power of k of the approximation equation of the mutual impedance between elements at a specified frequency, and stores the double integrals of that coefficient values for the surface patches.

When the memory means 14 is provided, i.e., there are two or more frequencies for analysis, the calculating means 13 uses the coefficient values stored in the memory means 14 to calculate the mutual impedances between wire elements at the specified frequency or uses the double integrals of the coefficient values stored in the memory means 14 to calculate the mutual impedances between surface patches at the specified frequency.

The simulation means 15 uses the mutual impedances between elements calculated by the calculating means 13 to find the current flowing through the elements, segmented by the segmenting means 11, of the electronic apparatus in accordance with the moment method.

Here, the simulation function of the simulation apparatus 1 of the present invention may be realized by a program. When the program is provided from a memory medium, the simulation apparatus 1 of the present invention is realized by installation of the program in a data processing apparatus to operate on the memory.

In the simulation apparatus 1 of the present invention configured in this way, the calculating means 13 assumes that a triangle function current approximating the piecewise sinusoidal function current will flow through the monopoles. For example, while the related art assumed the expansion functions for the monopoles <1> and <3> shown in FIG. 8 to be as follows:

Current monopole <1> $J_1 = \sin k(z-z_0)/\sin kd_1$
Current monopole <3> $J_2 = \sin k(t-t_0)/\sin kd_3$ the present invention assumes them to be Current monopole <1> $J_1 = (z-z_0)/d_1$
Current monopole <3> $J_2 = (t-t_0)/d_3$ From this, while the mutual impedance $Z_{13}$ between the monopole <1> and the monopole <3> was as follows in the related art:

$$Z_{13} = [j\omega\mu/(4\pi \sin kd_1 \sin kd_3)] \times$$
$$\int\int [\sin k(z-z_0)\sin k(t-t_0)\cos\phi - \cos k(z-z_0)\cos k(t-t_0)] \times$$
$$\exp(-jkr)/r \cdot dzdt$$

where $\int\int$ denotes the integrals from $t_0$ to $t_1$ and from $z_0$ to $z_1$ in the present invention it becomes $$Z_{13} = [j\omega\mu/(4\pi d_1 d_3)]$$
$$\times \int\int [(z-z_0)(t-t_0)\cos\phi - (1/k^2)]\exp(-jkr)/r \, dzdt$$

where $\int\int$ denotes the integrals from $t_0$ to $t_1$ and from $z_0$ to $z_1$ Further, the calculating means 13 approximates the exp$(-jkr)$ included in the equation by a multiplication between $\exp(-jkr_0)$ and a Taylor expansion of $\exp[-jk(r-r_0)]$. Here, j is an imaginary number, k is a wave number, r is any distance between monopoles, and $r_0$ is a representative distance between monopoles.

That is, $\exp(-jkr)$ is approximated by $\exp(jkr) \approx$ $\exp(-jkr_0)[1 - jk(r-r_0)]$ or, for greater precision, by $\exp(jkr) \approx \exp(-jkr_0)\left[1 - jk(r-r_0) - k^2(r-r_0)^2/2\right]$ or, for still greater precision, by $\exp(jkr) \approx \exp(-jkr_0)\left[1 - jk(r-r_0) - k^2(r-r_0)^2/2 + jk^3(r-r_0)^3/6\right]$ In this way, the calculating means 13 assumes that a triangle function current flows through the monopoles and approximates $\exp(-jkr)$ by a multiplication between $\exp(-jkr_0)$ and a Taylor expansion of $\exp[-jk(r-r_0)]$, and thus derives the mutual impedance Z between monopoles expressed by the function:

$$Z = e^{-jkr_0}[(a_0 + a_2k^2 + a_4k^4 + \ldots) + j(a_{-1}/k + a_1k + a_3k^3 + \ldots)] \quad (A)$$

The coefficient value $a_i$, of the mutual impedance Z between monopoles, derived at this time can be calculated by elementary functions as shown in the examples.

The calculating means 13 uses the approximation equation of the mutual impedance between monopoles, expressed by a polynomial of the power of k shown by the above equation (A), to calculate the mutual impedance between elements, segmented by the segmenting means 11, of the electronic apparatus in accordance with an analytical scheme. That is, the mutual impedance between wires is calculated by adding the mutual impedances between monopoles and the mutual impedance between surface patches is calculated by double integration of the mutual impedance between monopoles.

Based on the calculation of the calculating means 13, the simulating means 15 uses the mutual impedances between elements calculated by the calculating means 13 to find the electric current flowing through the elements, segmented by the segmenting means 11, of the electronic apparatus in accordance with the moment method.

In this way, the simulation apparatus 1 of the present invention is configured to segment an electronic apparatus into elements and, when a frequency is given, calculate the mutual impedances between elements and simulate the electric current flowing through the elements from these mutual impedances and the wave sources of the elements by the moment method. Further, it makes it possible to calculate the mutual impedances between elements by elementary functions at a high speed, so can simulate the current flowing through the elements at a high speed.

In this configuration, the calculating means 13 enters k having an imaginary number part into the approximation equation of the mutual impedance between monopoles expressed by a polynomial of the power of k, shown by the above equation (A), so as to calculate the mutual impedance between elements in a space with loss (e.g., a space filled with a plastic material). Due to this, it is possible to find the mutual impedance between elements in a space with loss extremely simply.

Further, as will be understood from the fact that the mutual impedance $Z_{13}$ between the monopole <1> and the monopole <3> is shown by $$Z_{13} = [j\omega\mu/(4\pi d_1 d_3)]$$
$$\times \int\int[(z-z_0)(t-t_0)\cos\phi - (1/k^2)]\exp(-jkr)/r \cdot dzdt$$

when the two monopoles are parallel (cos $\phi$=1) and when the two monopoles are perpendicular to each other (cos $\phi$=0), compared with the case where the two monopoles are not parallel and not perpendicular (cos $\phi\neq$1, 0), considering the fact that the coefficient value $a_i$ of the above equation (A) is simply found, the calculating means 13 is provided separately with a first calculation routine used when the two monopoles are parallel, a second calculation routine used when the two monopoles are perpendicular to each other, and a third calculation routine used when the two monopoles are not parallel and not perpendicular. It is possible to use one calculation routine, in accordance with the angle formed by the two monopoles, out of the first to third calculation routines to calculate the mutual impedance between elements.

In consideration of the fact that when the lengths of the monopoles are short, precision can be ensured even if the level of expansion of the Taylor expansion of $\exp[-jk(r-r_0)]$ is small and that when the lengths of the monopoles become larger, the precision cannot be ensured unless the level of expansion of the Taylor expansion of $\exp[-jk(r-r_0)]$ is made larger, the calculating means 13 is provided with a plurality of calculation routines having different expansion levels of the Taylor expansion of $\exp[-jk(r-r_0)]$ and can use one calculation routine, in accordance with the length of the monopoles, out of these plurality of calculation routines to calculate the mutual impedance between elements.

The memory means 14 stores the coefficient values $a_i$ of the above equation (A) calculated by the calculating means 13. The calculating means 13 can use the stored coefficient values $a_i$ to calculate the mutual impedance between wires at a specified frequency (different from frequency used when calculating the coefficient values $a_i$).

Further, the memory means 14 stores the double integrals of the coefficient values $a_i$ of the above equation (A) calculated by the calculating means 13. The calculating means 13 can use the double integrals of the stored coefficient values $a_i$ stored to calculate the mutual impedances between surface patches at the specified frequency (different from the frequency used at the time of calculating the coefficient values $a_i$).

In this way, the simulation apparatus 1 of the present invention is configured to segment an electronic apparatus into elements and, when a frequency is given, calculate the mutual impedance between elements and simulate the electric current flowing through the elements from the thus calculated impedance and the wave sources of the elements by the moment method. Further, it makes it possible to calculate the mutual impedance between elements by elementary functions at a high speed, so can simulate the current flowing through the elements at a high speed.

Further, since it is configured to maintain the symmetry of the mutual impedances between elements and reaction matching while calculating the mutual impedances between elements, it is possible to simulate the current flowing through the elements at a high speed while maintaining the features of the related art.

The present invention will now be explained in further detail using embodiments.

Figure 2:
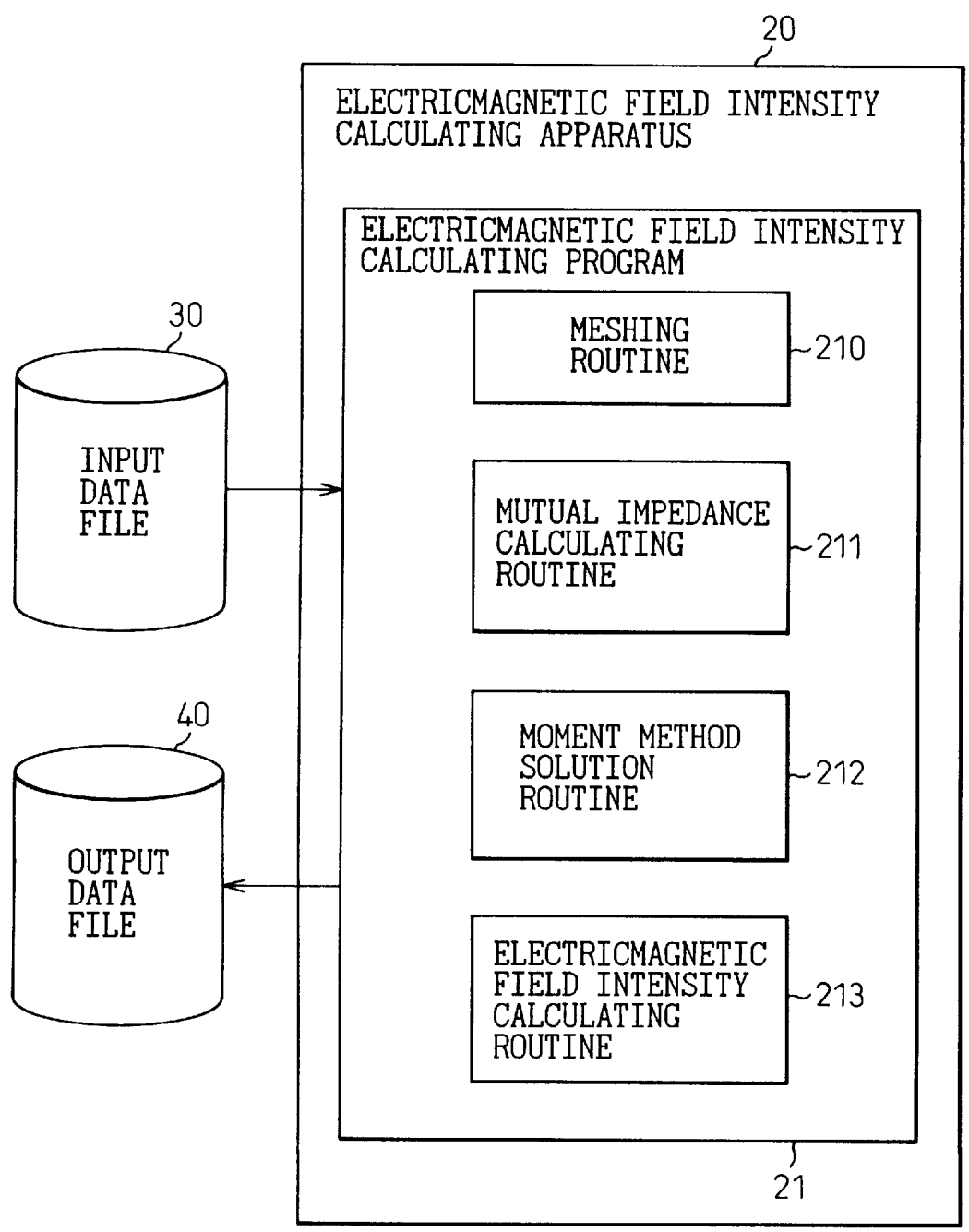
FIG. 2 is an example of the present invention.

FIG. 2 illustrates an embodiment of an apparatus 20 for calculating the intensity of an electromagnetic field embodying the present invention.

The electromagnetic field intensity calculating apparatus 20 is configured to run a program 21 for calculation of the electromagnetic field intensity having a meshing routine 210, a routine 211 for calculation of the mutual impedance, a routine 212 for solving simultaneous equations by the moment method, and a routine 213 for calculating the intensity of an electromagnetic field. It performs processing using the moment method to simulate the intensity of the electromagnetic field radiated from an electronic apparatus to be analyzed. The input data file 30 illustrated in the figure stores the configuration information on the electronic apparatus to be analyzed, while the output data file 40 stores the intensity of the electromagnetic field of the result of the simulation.

Here, when the program 21 for calculation of the electromagnetic field intensity is provided from a memory medium, the apparatus 1 for calculating the electromagnetic field intensity of the present invention is realized by installation of that program in a data processor to operate on the memory.

Figure 3:
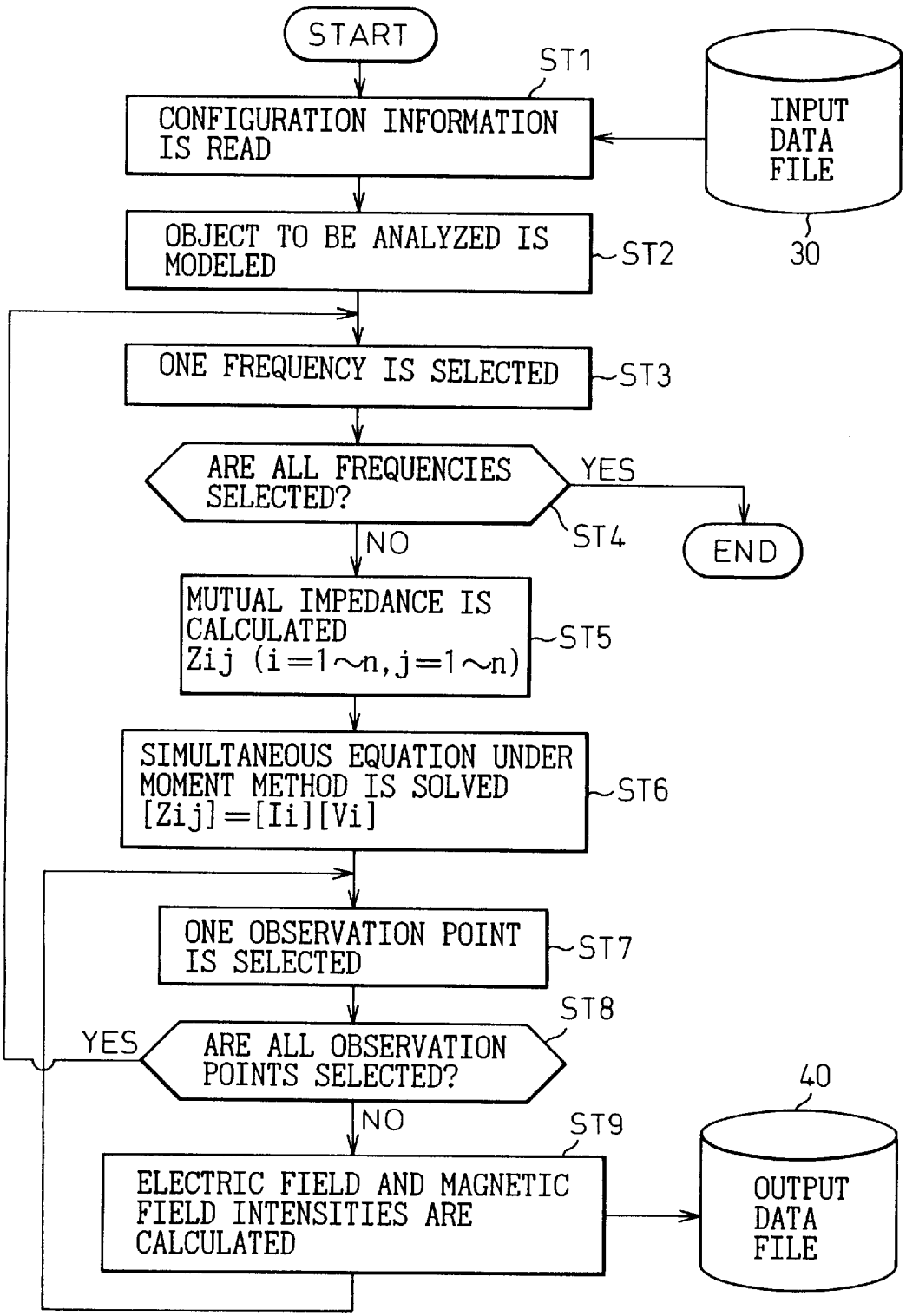
FIG. 3 is a flowchart of the processing executed by a program for calculating the intensity of an electromagnetic field.

FIG. 3 shows an embodiment of the flow of processing executed by the program 21 for calculation of the electromagnetic field intensity.

As shown by this flow of processing, the program 21 for calculation of the electromagnetic field intensity, when activated, first, at step (ST) 1, reads the configuration information on the electronic apparatus to be analyzed from the input data file 30, then at step 2 accesses the meshing routine 210, segments the electronic apparatus to be analyzed into a mesh based on the read configuration information, and generates a model for use of the moment method.

Next, at step 3, it selects one unprocessed frequency from among the frequencies to be processed, then at step 4 decides whether all of the frequencies have finished being selected. When deciding that all of the frequencies have finished being selected, it ends the processing.

On the other hand, when it decides that not all of the frequencies have finished being selected, that is, when deciding that a frequency could be selected at step 3, it proceeds to step 5, where it accesses the routine 211 for calculation of the mutual impedance and calculates the mutual impedance $Z_{ij}$ (i=1 to n, j=1 to n) between the mesh-like elements.

Next, at step 6, it accesses the routine 212 for a solution by the moment method and uses the mutual impedance $Z_{ij}$ calculated at step 5 and the voltage $V_i$ of the wave source, which wave source is specified by the configuration informations, to solve the simultaneous equations:

$$[Z_{ij}][I_i]=[V_i]$$

by the moment method and thereby calculate the currents $I_i$ flowing through the mesh-like elements.

Next, at step 7, it selects one unprocessed observation point from among predetermined observation points, then at step 8 decides whether all of the observation points have finished being selected. When deciding that all of the observation points have finished being selected, it returns to step 3 for processing the next frequency.

On the other hand, when it decides that not all of the observation points have finished being selected, that is, when deciding that an observation point could be selected at step 8, it proceeds to step 9, where it accesses the routine 213 for calculation of the electromagnetic field intensity, calculates the intensity of the electromagnetic field caused by the current $I_i$ flowing through the mesh-like elements calculated at step 6 at the observation point selected at step 7, stores the result of the calculation in the output data file 40, and then returns to step 7 to process the next observation point.

In this way, the program 21 for calculation of the electromagnetic field intensity performs processing using the moment method to simulate the intensity of the electromagnetic field radiated from the electronic apparatus to be analyzed.

Next, an explanation will be made of the processing for calculation of the mutual impedance executed by the routine 211 for calculation of the mutual impedance.

The routine 211 for calculation of the mutual impedance calculates the mutual impedance between monopoles to calculate the mutual impedance between mesh-like elements.

In calculating the mutual impedance between monopoles, the routine 211 for calculation of the mutual impedance assumes that a triangle function current flows through the monopoles.

Figure 4:
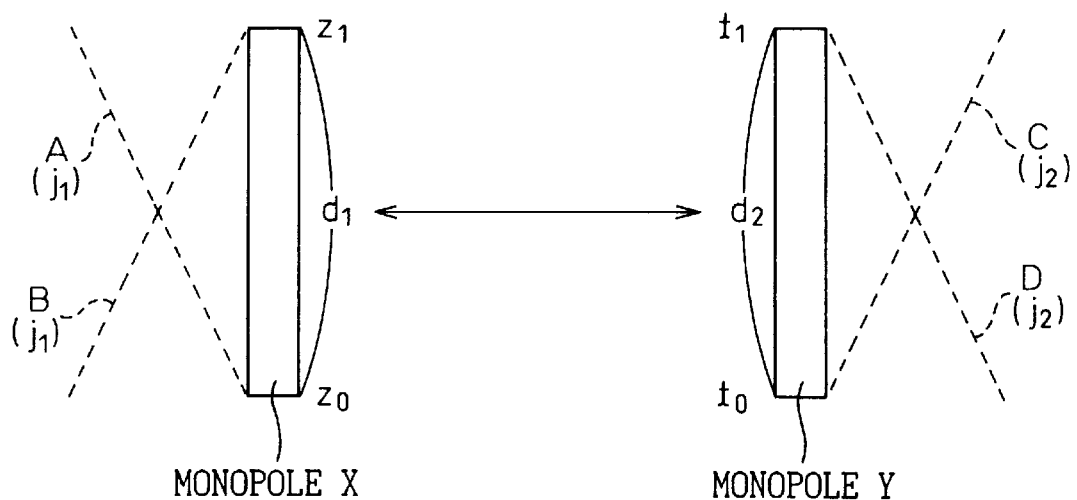
FIG. 4 is a view explaining the mutual impedance.

Due to this, there are four types of mutual impedances between monopoles which have to be calculated as shown in FIG. 4, that is:

(1) Mutual impedance $Z_{11}$ $$J_1=(z-z_0)/d_1, J_2=(t-t_0)/d_2$$

(2) Mutual impedance $Z_{00}$ $$J_1=(-z+z_1)/d_1, J_2=(-t+t_1)/d_2$$

(3) Mutual impedance $Z_{01}$ $$J_1=(-z+z_1)/d_1, J_2=(t-t_0)/d_2$$

(4) Mutual impedance $Z_{10}$ $$J_1=(z-z_0)/d_1, J_2=(-t+t_1)/d_2$$

Here, $d_1$ is the length of the monopole X and $d_2$ is the length of the monopole Y.

From this, giving an explanation regarding the mutual impedance $Z_{11}$, by substituting $$J_1=(z-z_0)/d_1, J_2=(t-t_0)/d_2$$

into the general equation of the mutual impedance $Z_{ij}$ illustrated in FIG. 9, the following is obtained:

$$Z_{11}=[j(j\omega\mu/(4\pi d_1 d_2)]$$
$$\times \int\int [(z-z_0)(t-t_0)\cos\phi-(1/k^2)]\exp(-jkr)/r\,dz\,dt$$

where $\int\int$ denotes the integrals from $t_0$ to $t_1$ and from $z_0$ to $z_1$ and $\mu$ is the permeability.

On the other hand, the routine 211 for calculation of the mutual impedance approximates the exp(-jkr) required in the calculation of the mutual impedance between monopoles by $$\exp(-jkr)\approx\exp(-jkr_0)[1-jk(r-r_0)]$$

(hereinafter this approximation being referred to as approximation case 1), or, for greater precision, by $$\exp(-jkr)\approx\exp(-jkr_0)[1-jk(r-r_0)-k^2(r-r_0)^2/2]$$

(hereinafter this approximation being referred to as approximation case 2), or, for still greater precision, by $$\exp(-jkr)\approx\exp(-jkr_0)[1-jk(r-r_0)-k^2(r-r_0)^2/2+jk^3(-r_0)^3/6]$$

(hereinafter this approximation being referred to as approximation case 3).

Here, $r_0$ is a representative distance between monopoles. As explained in FIG. 8, the following relationship:

$$r=(z^2+t^2-2zt\cos\phi+h^2)^{1/2}$$

stands among any position z of the monopole X, any position t of the monopole Y, the distance h between the monopole X and the monopole Y, and the angle $\phi$ formed between the monopole X and the monopole Y, so for example when the distance between the center point of the monopole X and the center point of the monopole Y is defined as the representative distance $r_0$ between monopoles, the representative distance $r_0$ between monopoles becomes $$r_0 = [(z_1+z_0)^2/4 + (t_1+t_0)^2/4 - \cos\phi(z_1+z_0)(t_1+t_0)/2 + h^2]^{1/2}$$

From this, when following approximation case 1, by substituting $$Z_{11} = [j\omega\mu/(4\pi d_1 d_2)] \times$$
$$\iint [(z-z_0)(t-t_0)\cos\phi - (1/k^2)]\exp(-jkr)/r \cdot dzdt$$

where $\iint$ denotes the integrals from $t_0$ to $t_1$ and from $z_0$ to $z_1$, by $$\exp(-jkr) \approx \exp(-jkr_0)[1 - jk(r-r_0)]$$

the following is obtained:

$$Z_{11} = [(j(\mu/\varepsilon))^{1/2}/(4\pi d_1 d_2)]\exp(-jkr_0) \times$$
$$\iint [-1 + (r_0/r) + k^2((z-z_0)(t-t_0) - (z-z_0)(t-t_0)r_0/r)\cos\phi -$$
$$j/(kr) + jk\cos\phi(z-z_0)(t-t_0)/r] \cdot dzdt$$

where $\iint$ denotes the integrals from $t_0$ to $t_1$ and from $z_0$ to $z_1$ and $\varepsilon$ denotes the permittivity.

Further, when following approximation case 2, by substituting $$Z_{11} = [j\omega\mu/(4\pi d_1 d_2)]$$
$$\times \iint [(z-z_0)(t-t_0)\cos\phi - (1/k^2)]\exp(-jkr)/r \cdot dzdt$$

where $\iint$ denotes the integrals from $t_0$ to $t_1$ and from $z_0$ to $z_1$, by $$\exp(-jkr) \approx \exp(-jkr_0)[1 - jk(r-r_0) - k^2(r-r_0)^2/2]$$

the following is obtained:

$$Z_{11} = [(j(\mu/\varepsilon))^{1/2}/(4\pi d_1 d_2)]\exp(-jkr_0) \times \iint [-1 + (r_0/r) +$$
$$k^2((z-z_0)(t-t_0) - (z-z_0)(t-t_0)r_0/r)\cos\phi - j/(kr) +$$
$$jk\cos\phi(z-z_0)(t-t_0)/r + r/2 - r_0 + r_0^2/(2r)) +$$
$$jk^3(-\cos\phi(z-z_0)(t-t_0)r/2 + r_0\cos\phi(z-z_0)(t-t_0) -$$
$$r_0^2\cos\phi(z-z_0)(t-t_0)/(2r))] \cdot dzdt$$

where $\iint$ denotes the integrals from $t_0$ to $t_1$ and from $z_0$ to $z_1$.

Further, when following approximation case 3, by substituting $$Z_{11} = [j\omega\mu/(4\pi d_1 d_2)]$$
$$\times \iint [(z-z_0)(t-t_0)\cos\phi - (1/k^2)]\exp(-jkr)/r \cdot dzdt$$

where $\iint$ denotes the integrals from $t_0$ to $t_1$ and from $z_0$ to $z_1$, by $$\exp(-jkr) \approx \exp(-jkr_0)[1 - jk(r-r_0) - k^2(r-r_0)^2/2 + jk^3(r-r_0)^3/6]$$

the following is obtained:

$$Z_{11} = [(j(\mu/\varepsilon))^{1/2}/(4\pi d_1 d_2)]\exp(-jkr_0) \times$$
$$\iint [-1 + (r_0/r) + k^2(\cos\phi(z-z_0)(t-t_0) - r_0\cos\phi(z-z_0)(t-t_0)/r +$$
$$r^2/6 - r_0 r/2 + r_0^2/2 - r_0^3/(6r)) +$$

$$k^4(\cos\phi(z-z_0)(t-t_0)r^2/6 - r_0\cos\phi(z-z_0)(t-t_0)r/2 +$$
$$(z-z_0)(t-t_0)\cos\phi r_0^2/2 - (z-z_0)(t-t_0)r_0^3\cos\phi/(6r)) -$$
$$j/(kr) + jk(\cos\phi(z-z_0)(t-t_0)/r + r/2 - r_0 + r_0^2/(2r)) +$$
$$jk^3(-\cos\phi(z-z_0)(t-t_0)r/2 + r_0\cos\phi(z-z_0)(t-t_0) -$$
$$r_0^2\cos\phi(z-z_0)(t-t_0)/(2r))] \cdot dzdt$$

where $\iint$ denotes the integrals from $t_0$ to $t_1$ and from $z_0$ to $z_1$.

As explained above, the mutual impedance $Z_{11}$ shown in FIG. 4, when following the approximation case 1, becomes:

$$Z_{11} = [j(\mu/\varepsilon)^{1/2}/(4\pi d_1 d_2)]\exp(-jkr_0) \times$$
$$\iint [-1 + (r_0/r) + k^2((z-z_0)(t-t_0) - (z-z_0)(t-t_0)r_0/r)\cos\phi -$$
$$j/kr + jk\cos(z-z_0)(t-t_0)/r] \cdot dzdt$$

where $\iint$ denotes the integrals from $t_0$ to $t_1$ and from $z_0$ to $z_1$.

This may be cleaned up to $$Z_{11} = [j(\mu/\varepsilon)^{1/2}/(4\pi d_1 d_2)]\exp(-jkr_0) \times \iint [-1 + (r_0/r) +$$
$$k^2((zt - t_0z - z_0t + z_0t_0 + (-zt + t_0z + z_0t - z_0t_0)r_0/r)\cos\phi -$$
$$j/(kr) + jk(zt - t_0z - z_0t + z_0t_0)\cos\phi/r] \cdot dzdt$$

where $\iint$ denotes the integrals from $t_0$ to $t_1$ and from $z_0$ to $z_1$.

Similarly, for the mutual impedance $Z_{00}$ shown in FIG. 4, by substituting $$J_1 = (z+z_1)/d_1, \quad J_2 = (t+t_1)/d_2$$

into the general equation of the mutual impedance $Z_{ij}$ shown in FIG. 9, the following is obtained:

$$Z_{00} = [j\omega\mu/(4\pi d_1 d_2)]$$
$$\times \iint [(z-z_1)(t-t_1)\cos\phi - (1/k^2)]\exp(-jkr)/r \cdot dzdt$$

where $\iint$ denotes the integrals from $t_0$ to $t_1$ and from $z_0$ to $z_1$.

In the case of following the approximation case 1, by substituting the above by $$\exp(-jkr) \approx \exp(-jkr_0)[1 - jk(r-r_0)]$$

the following is obtained:

$$Z_{00} = [(j(\mu/\varepsilon))^{1/2}/(4\pi d_1 d_2)]\exp(-jkr_0) \times$$
$$\iint [-1 + (r_0/r) + k^2((z-z_1)(t-t_1) - (z-z_1)(t-t_1)r_0/r)\cos\phi -$$
$$j/(kr) + jk\cos\phi(z-z_1)(t-t_1)/r] \cdot dzdt$$

where $\iint$ denotes the integrals from $t_0$ to $t_1$ and from $z_0$ to $z_1$.

Cleaning this up, the following is obtained:

$$Z_{00} = [j(\mu/\varepsilon)^{1/2}/(4\pi d_1 d_2)]\exp(-jkr_0) \times \iint [-1 + (r_0/r) +$$
$$k^2((zt - t_1 z - z_1 t + z_1 t_1 + (-zt + t_1 z + z_1 t - z_1 t_1)r_0/r)\cos\phi -$$
$$j/(kr) + jk(zt - t_1 z - z_1 t + z_1 t_1)\cos\phi/r] \cdot dz dt$$

where $\iint$ denotes the integrals from $t_0$ to $t_1$ and from $z_0$ to $z_1$.

Similarly, for the mutual impedance $Z_{01}$ shown in FIG. 4, by substituting $$J_1 = (z+z_1)/d_1, \quad J_2 = (t-t_0)/d_2$$

into the general equation of the mutual impedance $Z_{ij}$ shown in FIG. 9, the following is obtained:

$$Z_{01} = [j\omega\mu/(4\pi d_1 d_2)]$$
$$\times \iint [(z-z_1)(t-t_0)\cos\phi + 1/k^2]\exp(-jkr)/r \, dz dt$$

where $\iint$ denotes the integrals from $t_0$ to $t_1$ and from $z_0$ to $z_1$.

In the case of following the approximation case 1, by substituting the above by $$\exp(-jkr) \approx \exp(-jkr_0)[1 - jk(r - r_0)]$$

the following is obtained:

$$Z_{01} = [(j(\mu/\varepsilon))^{1/2}/(4\pi d_1 d_2)]\exp(-jkr_0) \times$$
$$\iint [1 - (r_0/r) + k^2(-(z-z_1)(t-t_0) + (z-z_1)(t-t_0)r_0/r)\cos\phi +$$
$$j/(kr) - jk\cos\phi(z-z_1)(t-t_0)/r] \cdot dz dt$$

where $\iint$ denotes the integrals from $t_0$ to $t_1$ and from $z_0$ to $z_1$.

Cleaning this up, the following is obtained:

$$Z_{01} = [(j(\mu/\varepsilon))^{1/2}/(4\pi d_1 d_2)]\exp(-jkr_0) \times \iint [1 - (r_0/r) +$$
$$k^2(-zt + t_0 z + z_1 t - z_1 t_0 + (zt - t_0 z - z_1 t + z_1 t_0)r_0/r)\cos\phi +$$
$$j/(kr) + jk(-zt + t_0 z + z_1 t - z_1 t_0)\cos\phi/r] \cdot dz dt$$

where $\iint$ denotes the integrals from $t_0$ to $t_1$ and from $z_0$ to $z_1$.

Similarly, for the mutual impedance $Z_{10}$ shown in FIG. 4, by substituting $$J_1 = (z-z_0)/d_1, \quad J_2 = (t+t_1)/d_2$$

into the general equation of the mutual impedance $Z_{ij}$ shown in FIG. 9, the following is obtained:

$$Z_{10} = [j\omega\mu/(4\pi d_1 d_2)]$$
$$\times \iint [-(z-z_0)(t-t_1)\cos\phi + 1/k^2]\exp(-jkr)/r \, dz dt$$

where $\iint$ denotes the integrals from $t_0$ to $t_1$ and from $z_0$ to $z_1$.

When following the approximation case 1, by substituting the above by $$\exp(-jkr) \approx \exp(-jkr_0)[1 - jk(r - r_0)]$$

the following is obtained:

$$Z_{10} = [(j(\mu/\varepsilon))^{1/2}/(4\pi d_1 d_2)]\exp(-jkr_0) \times$$
$$\iint [1 - (r_0/r) + k^2(-(z-z_0)(t-t_1) + (z-z_0)(t-t_1)r_0/r)\cos\phi +$$
$$j/(kr) - jk\cos\phi(z-z_0)(t-t_1)/r] \cdot dz dt$$

where $\iint$ denotes the integrals from $t_0$ to $t_1$ and from $z_0$ to $z_1$.

Cleaning this up, the following is obtained:

$$Z_{10} = [(j(\mu/\varepsilon))^{1/2}/(4\pi d_1 d_2)]\exp(-jkr_0) \times \iint [1 - (r_0/r) +$$
$$k^2(-zt + t_1 z + z_0 t - z_0 t_1 + (zt - t_1 z - z_0 t + z_0 t_1)r_0/r)\cos\phi +$$
$$j/(kr) + jk(-zt + t_1 z + z_0 t - z_0 t_1)\cos\phi/r] \cdot dz dt$$

where $\iint$ denotes the integrals from $t_0$ to $t_1$ and from $z_0$ to $z_1$.

As will be understood from the above explanation, the mutual impedances $Z_{11}$, $Z_{00}$, $Z_{01}$, and $Z_{10}$ between the monopoles shown in FIG. 4 may, when following the approximation case 1, be found by calculating the following:

$$\iint 1/r \, dz dt \tag{1}$$

$$\iint (t_0 z/r + z_0 t/r) \cdot dz dt \tag{2}$$

where, according to the combination of monopoles, $t_0 \to t_1$, $z_0 \to z_1$ $$\iint zt/r \, dz dt \tag{3}$$

$$\iint zt \cdot dz dt \tag{4}$$

$$\iint z \cdot dz dt \tag{5}$$

$$\iint t \cdot dz dt \tag{6}$$

$$\iint dz dt \tag{7}$$

Further, when following the approximation case 2 or the approximation case 3, it may be found by additionally calculating the following:

$$\iint r \cdot dz dt \tag{8}$$

$$\iint ztr \cdot dz dt \tag{9}$$

$$\iint (t_0 zr + z_0 tr) \cdot dz dt \tag{10}$$

Where, according to the combination of monopoles, $t_0 \to t_1$, $z_0 \to z_1$. Here $\iint$ denotes the integrals from $t_0$ to $t_1$ and from $z_0$ to $z_1$.

Next, an explanation will be made of the fact that these values may be calculated by elementary functions.

Here, equations (4), (5), (6), and (7) are self-evident, so explanations will be omitted.

First, an explanation will be given of the case where the two monopoles cross ($\cos\phi \neq 1$).

The following definitions will first be made (where m is 1 or 0 and n is 1 or 0):

$$r_{mn} = (z_m^2 + t_n^2 - 2z_m t_n \cos\phi + h^2)^{1/2}$$

$$a = [(1+\cos\phi)/(1-\cos\phi)]^{1/2}$$

$u_{11}=r_{11}+z_1-t_1\cos\phi$, $u_{10}=r_{10}+z_1-t_0\cos\phi$ $u_{01}=r_{01}+z_0-t_1\cos\phi$, $u_{00}=r_{00}+z_0-t_0\cos\phi$ $v_{11}=r_{11}+t_1-z_1\cos\phi$, $v_{10}=r_{10}+t_1-z_0\cos\phi$ $v_{01}=r_{01}+t_0-z_1\cos\phi$, $v_{00}=r_{00}+t_0-z_0\cos\phi$ $q_1=z_1{}^2\sin^2\phi+h^2$, $q_0=z_0{}^2\sin^2\phi+h^2$ $p_1=t_1{}^2\sin^2\phi+h^2$, $p_0=t_0{}^2\sin^2\phi+h^2$ Here, $z_1$, $z_2$ are the coordinates of the monopole X (FIG. 4), $t_1$, $t_2$ are the coordinates of the monopole Y (FIG. 4), $\phi$ is the angle formed by the monopole X and the monopole Y (FIG. 8), and h is the distance between the monopole X and the monopole Y (FIG. 8), so everything is known. Further, $r_{11}$, $r_{01}$, $r_{10}$, and $r_{00}$ show the four distances between the two ends of the monopole X and the two ends of the monopole Y and can be calculated from $z_1$, $z_2$, $t_1$, and $t_2$. Accordingly, the values defined here all become known.

If these definitions are used, then equation (1) becomes expressed as:

$$\int\int 1/r\cdot dz\,dt =$$
$$t_1\ln u_{11} - t_1\ln u_{01} - t_0\ln u_{10} + t_0\ln u_{00} + z_1\ln v_{11} - z_1\ln v_{10} - z_0\ln v_{01} +$$
$$z_0\ln v_{00} - [(h/*\sin\phi*)][\tan^{-1}(a/(r_{11}+t_1+z_1)) - \tan^{-1}(a/(r_{10}+t_0+z_1)) - \tan^{-1}(a/(r_{01}+t_1+z_0)) + \tan^{-1}(a/(r_{00}+t_0+z_1))] -$$
$$2a[\tan^{-1}(a/(r_{11}-t_1-z_1)) - \tan^{-1}(a/(r_{10}-t_0-z_1))] +$$
$$2a[\tan^{-1}(a/(r_{01}-t_1-z_0)) - \tan^{-1}(a/(r_{00}-t_0-z_0))]$$

where, $*\sin\phi*$ is the absolute value of $\sin\phi$ and $\ln$ is a common logarithm. That is, it may be analytically found.

Further, if these definitions are used, equation (2) becomes expressed as:

$$\int\int (t_0z/r+z_0t/r)\cdot dz\,dt = [(t_0+z_0\cos\phi)/\sin^2\phi]\left[\int\int (z-t\cos\phi)/r\cdot dz\,dt\right] + [(z_0+t_0\cos\phi)/\sin^2\phi]\left[\int\int (t-z\cos\phi)/r\cdot dz\,dt\right]$$

$$= [(t_0+z_0\cos\phi)/\sin^2\phi][\cos\phi z_1(r_{11}-r_{10})/2 + \cos\phi z_0(r_{00}-r_{01})/2 - t_1(r_{11}-r_{01})/2 - t_0(r_{00}-r_{10})/2 - (q_1\ln(v_{11}/v_{10}))/2 + (q_0\ln(v_{01}/v_{00}))/2] +$$
$$[(t_0+z_0\cos\phi)/\sin^2\phi][\cos\phi t_1(r_{11}-r_{01})/2 + \cos\phi t_0(r_{00}-r_{10})/2 - z_1(r_{11}-r_{10})/2 - z_0(r_{00}-r_{01})/2 - (p_1\ln(u_{11}/u_{01}))/2 + (p_0\ln(u_{10}/u_{00}))/2]$$

That is, it may be analytically found.

Further, if these definitions are used, then equation (3) becomes expressed as:

$$\int\int zt/r\cdot dz\,dt = [\cos\phi/3][t_1^3\ln(u_{11}/u_{01}) + t_0^3\ln(u_{00}/u_{10})] + [\cos\phi/3][z_1^3\ln(v_{11}/v_{10}) + z_0^3\ln(v_{00}/v_{01})] +$$
$$2h^3\cos\phi/3*\sin\phi*^3)][\tan^{-1}(a/(r_{11}+t_1+z_1)) -$$

-continued
$$\tan^{-1}(a/(r_{10}+t_0+z_1)) - \tan^{-1}(a/(r_{01}+t_1+z_0)) +$$
$$\tan^{-1}(a/(r_{00}+t_0+z_0))] + [z_1^2(r_{11}-r_{10})/3 +$$
$$z_0^2(r_{00}-r_{01})/3 + t_1^2(r_{11}-r_{01})/3 +$$
$$t_0^2(r_{00}-r_{10})/3] + [h^2/(3\sin^2\phi)][r_{11}-r_{10}-r_{01}+r_{00}]$$

where, $*\sin\phi*$ is the absolute value of $\sin\phi$.
Therefore, it may be analytically found.

Further, if these definitions are used, then equation (8) becomes expressed as:

$$\int\int r\cdot dz\,dt = [-\cos\phi/6][z_1^2(r_{11}-r_{10}) + z_0^2(r_{00}-r_{01}) + t_1^2(r_{11}-r_{01}) +$$
$$t_0^2(r_{00}-r_{10})] + [(z_1t_1r_{11}-z_1t_0r_{10}-z_0t_1r_{01}+z_0t_0r_{00})/$$
$$3] - [2h^3/3*\sin\phi*)][\tan^{-1}(a/(r_{11}+t_1+z_1)) -$$
$$\tan^{-1}(a/(r_{10}+t_0+z_1)) - \tan^{-1}(a/(r_{01}+t_1+z_0)) +$$
$$\tan^{-1}(a/(r_{00}+t_0+z_0))] + [h^2t_1/2 +$$
$$t_1^3\sin^2\phi/6][\ln(u_{11}/u_{01})] + [h^2t_0/2 +$$
$$t_0^3\sin^2\phi/6][\ln(u_{00}/u_{10})] + [h^2z_1/2 +$$
$$z_1^3\sin^2\phi/6][\ln(v_{11}/v_{10})] + [h^2z_0/2 + z_0^3\sin^2\phi/6][\ln(v_{00}/v_{01})]$$

where, $*\sin\phi*$ is the absolute value of $\sin\phi$.
That is, it may be analytically found.

Further, if these definitions are used, then equation (9) becomes expressed as:

$$\int\int ztr\cdot dz\,dr = [t_1^5\sin^2\phi\cos\phi/10 +$$
$$h^2t_1^3\cos\phi/6][\ln(u_{11}/u_{01})] + [t_0^5\sin^2\phi\cos\phi/10 +$$
$$h^2t_0^3\cos\phi/6][\ln(u_{00}/u_{10})] + [z_1^5\sin^2\phi\cos\phi/10 +$$
$$h^2z_1^3\cos\phi/6][\ln(v_{11}/v_{10})] + [z_0^5\sin^2\phi\cos\phi/10 +$$
$$h^2z_0^3\cos\phi/6][\ln(v_{00}/v_{01})] + [1/15 -$$
$$\cos^2\phi/10][(t_1^4+z_1^4)r_{11} - (t_0^4+z_1^4)r_{10} - (t_1^4+z_0^4)r_{01} +$$
$$(t_0^4+z_0^4)r_{00}] + [\cos\phi/30][(z_1t_1^3+z_1^3t_1)r_{11} - (z_1t_0^3+z_1^3t_0)r_{10} +$$
$$(z_0t_1^3+z_0^3t_1)r_{01} - (z_0t_0^3+z_0^3t_0)r_{00}] + [2/15][z_1^2t_1^2r_{11} - z_1^2t_0^2r_{10} -$$
$$z_0^2t_1^2r_{01} + z_0^2t_0^2r_{00}] + [2h^2/15][(t_1^2+z_1^2)r_{11} - (t_0^2+z_1^2)r_{10} -$$
$$(t_1^2+z_0^2)r_{01} + (t_0^2+z_0^2)r_{00}] + [h^4/(15\sin^2\phi)][r_{11}-r_{10}-r_{01} +$$
$$r_{00}] + [2\cos\phi h^5/(15*\sin\phi*^3)][\tan^{-1}(a/(r_{11}+t_1+z_1)) -$$
$$\tan^{-1}(a/(r_{10}+t_0+z_1)) -$$
$$\tan^{-1}(a/(r_{01}+t_1+z_0)) + \tan^{-1}(a/(r_{00}+t_0+z_0))]$$

where, $*\sin\phi*$ is the absolute value of $\sin\phi$. That is, it may be analytically found.

Further, if these definitions are used, then equation (10) becomes expressed as follows:

$$\int\int (t_0zr+z_0tr)\cdot dz\,dr = [(t_0+z_0\cos\phi)/$$
$$(3\sin^2\phi)]\times[(1/4)r_{11}^3(t_1-z_1\cos\phi) + (3q_1/8)r_{11}(t_1-z_1\cos\phi) +$$
$$(3q_1^2/8)\ln v_{11} - (1/4)r_{10}^3(t_0-z_1\cos\phi) -$$
$$(3q_1/8)r_{10}(t_0-z_1\cos\phi) - (3q_1^2/8)\ln v_{10} - (1/4)r_{01}^3(t_1-z_0\cos\phi) -$$

-continued
$$(3q_1/8)r_{01}(t_1 - z_0\cos\phi) - (3q_0^2/8)\ln v_{01} + (1/4)r_{00}^3(t_0 - z_0\cos\phi) +$$
$$(3q_1/8)r_{00}(t_0 - z_1\cos\phi) + (3q_0^2/8)\ln v_{00}] + [(z_0 + t_0\cos\phi)/$$
$$(3\sin^2\phi)] \times [(1/4)r_{11}^3(z_1 - t_1\cos\phi)) +$$
$$(3p_1/8)r_{11}(z_1 - t_1\cos\phi) + (3p_1^2/8)\ln u_{11} -$$
$$(1/4)r_{01}^3(z_0 - t_1\cos\phi) - (3p_1/8)r_{01}(z_0 - t_1\cos\phi) -$$
$$(3p_1^2/8)\ln u_{01} - (1/4)r_{10}^3(z_1 - t_0\cos\phi) -$$
$$(3p_0/8)r_{10}(z_1 - t_0\cos\phi) -$$
$$(3p_0^2/8)\ln u_{10} + (1/4)r_{00}^3(z_0 - t_0\cos\phi) +$$
$$(3p_0/8)r_{00}(z_0 - t_0\cos\phi) + (3p_0^2/8)\ln u_{00}]$$

That is, it may be analytically found.

In this way, when the two monopoles cross ($\cos\phi \neq 1$), the mutual impedances $Z_{11}$, $Z_{00}$, $Z_{01}$, and $Z_{10}$ between the monopoles X and Y shown in FIG. 4 can be calculated by elementary functions.

Next, an explanation will be made of the case where the two monopoles are parallel ($\cos\phi = 1$). Here, since "$\cos\phi = 1$", "$r = ((z-t)^2 + h^2)^{1/2}$" stands.

The following definitions are set. As explained above, the values defined here all become known.

$u_{11} = r_{11} + z_1 - t_1$, $u_{00} = r_{00} + z_0 - t_0$ $v_{11} = r_{11} + t_1 - z_1$, $v_{10} = r_{10} + t_0 - z_1$ $v_{01} = r_{01} + t_1 - z_0$, $v_{00} = r_{00} + t_0 - z_0$

If these definitions are used, equation (1) becomes expressed as:

$$\int\int 1/r \cdot dz dt = t_1 \ln(u_{11}/u_{01}) + t_0 \ln(u_{00}/u_{10}) +$$
$$z_1 \ln(u_{11}/u_{10}) + z_0 \ln(u_{00}/u_{01}) + r_{11} - r_{10} - r_{01} + r_{00}$$

That is, it may be analytically found.

Further, if these definitions are used, the "$\int\int t/r \cdot dzdt$" comprising part of equation (2) becomes expressed as:

$$\int\int t/r \cdot dz dt =$$
$$(t_1^2/2)\ln(u_{11}/u_{01}) + (t_0^2/2)\ln(u_{00}/u_{10}) + (z_1^2/2 - h^2/4)\ln(v_{11}/v_{10}) +$$
$$(z_0^2/2 - h^2/4)\ln(v_{00}/v_{01}) + (3z_1/4)(r_{11} - r_{10}) +$$
$$(3z_0/4)(r_{00} - r_{01}) + (t_1/4)(r_{11} - r_{01}) + (t_0/4)(r_{00} - r_{10})$$

That is, it may be analytically found.

Further, if these definitions are used, the $\int\int z/r \cdot dzdt$ comprising part of equation (2) becomes expressed as:

$$\int\int z/r \cdot dz dt =$$
$$(z_1^2/2)\ln(v_{11}/v_{10}) + (z_0^2/2)\ln(v_{00}/v_{01}) + (t_1^2/2 - h^2/4)\ln(u_{11}/u_{01}) +$$
$$(t_0^2/2 - h^2/4)\ln(u_{00}/u_{10}) + (z_1/4)(r_{11} - r_{10}) +$$
$$(z_0/4)(r_{00} - r_{01}) + (3t_1/4)(r_{11} - r_{01}) + (3t_0/4)(r_{00} - r_{10})$$

That is, it may be analytically found.

Further, if these definitions are used, equation (3) becomes expressed as:

$$\int\int zt/r \cdot dz dt =$$
$$(z_1^3/3)\ln(v_{11}/v_{10}) + (z_0^3/3)\ln(v_{00}/v_{01}) + (t_1^3/3)\ln(u_{11}/u_{01}) +$$
$$(t_0^3/3)\ln(u_{00}/u_{10}) + r_{11}((4t_1^2/9) + (4z_1^2/9) + (z_1 t_1/9) + (h^2/9)) -$$
$$r_{10}((4t_0^2/9) + (4z_1^2/9) + (z_1 t_0/9) + (h^2/9)) -$$
$$r_{01}((4t_1^2/9) + (4z_0^2/9) + (z_0 t_1/9) + (h^2/9)) +$$
$$r_{00}((4t_0^2/9) + (4z_0^2/9) + (z_0 t_0/9) + (h^2/9))$$

That is, it may be analytically found.

Further, if these definitions are used, equation (8) becomes expressed as:

$$\int\int r \cdot dz dt = (h^2 t_1/2)\ln(u_{11}/u_{01}) + (h^2 t_0/2)\ln(u_{00}/u_{10}) +$$
$$(h^2 z_1/2)\ln(v_{11}/v_{10}) + (h^2 z_0/2)\ln(v_{00}/v_{01}) -$$
$$(1/6)[z_1^2(r_{11} - r_{10}) + z_0^2(r_{00} - r_{01}) + t_1^2(r_{11} - r_{01}) + t_0^2(r_{00} - r_{10})] +$$
$$(1/3)(r_{11}z_1 t_1 - r_{10}z_1 t_0 - r_{01}z_0 t_1 + r_{00}z_0 t_0) +$$
$$(h^2/3)(r_{11} - r_{10} - r_{01} + r_{00})$$

That is, it may be analytically found.

Further, if these definitions are used, equation (9) becomes expressed as:

$$\int\int ztr \cdot dz dt =$$
$$(-1/30)[z_1^4(r_{11} - r_{10}) + z_0^4(r_{00} - r_{01}) + t_1^4(r_{11} - r_{01}) + t_0^4(r_{00} - r_{10})] -$$
$$(1/30)[z_1 t_1(z_1^2 + t_1^2)r_{11} - z_1 t_0(z_1^2 + t_0^2)r_{10} - z_0 t_1(z_0^2 + t_1^2)r_{01} +$$
$$z_0 t_0(z_0^2 + t_0^2)r_{00}] + (2/15)[z_1^2 t_1^2 r_{11} - z_1^2 t_0^2 r_{10} - z_0^2 t_1^2 r_{01} + z_0^2 t_0^2 r_{00}] +$$
$$(h^2/45)[z_1 t_1 r_{11} - z_1 t_0 r_{10} - z_0 t_1 r_{01} + z_0 t_0 r_{00}] +$$
$$(7h^2/45)[z_1^2(r_{11} - r_{10}) + z_0^2(r_{00} - r_{01}) + t_1^2(r_{11} - r_{01}) + t_0^2(r_{00} - r_{10})] +$$
$$(h^2/45)[r_{11} - r_{10} - r_{01} + r_{00}] + (h^2 z_1^3/6)\ln(v_{11}/v_{10}) +$$
$$(h^2 z_0^3/6)\ln(v_{00}/v_{01}) + (h^2 t_1^3/6)\ln(u_{11}/u_{01}) + (h^2 t_0^3/6)\ln(u_{00}/u_{10})$$

That is, it may be analytically found.

Further, if these definitions are used, "$\int\int tr \cdot dzdr$" comprising part of equation (10) becomes expressed as:

$$\int\int tr \cdot dz dr = (h^2 z_1^2/4)\ln(v_{11}/v_{10}) + (h^2 z_0^2/4)\ln(v_{00}/v_{10}) +$$
$$(h^2 t_1^2/4)\ln(u_{11}/u_{01}) + (h^2 t_0^2/4)\ln(u_{00}/u_{10}) -$$
$$(h^4/16)\ln(v_{00}v_{11}/(v_{01}v_{10})) - (1/24)[z_1^3(r_{11} - r_{10}) + z_0^3(r_{00} - r_{01})] -$$
$$(1/8)[t_1^3(r_{11} - r_{01}) + t_0^3(r_{00} - r_{10})] -$$
$$(1/24)[z_1^2 t_1 r_{11} - z_1^2 t_0 r_{10} - z_0^2 t_1 r_{01} + z_0^2 t_0 r_{00}] +$$
$$(5/24)[z_1 t_1^2 r_{11} - z_1 t_0^2 r_{10} - z_0 t_1^2 r_{01} + z_0 t_0^2 r_{00}] +$$
$$(13/48)h^2[z_1(r_{11} - r_{10}) + z_0(r_{00} - r_{01})] +$$
$$(1/16)h^2[t_1(r_{11} - r_{01}) + t_0(r_{00} - r_{10})]$$

That is, it may be analytically found.

Further, if these definitions are used, "$\int\int zr \cdot dzdr$" comprising part of equation (10) becomes expressed as:

$$\int\int zr \cdot dz dr = (h^2 z_1^2/4)\ln(v_{11}/v_{10}) + (h^2 z_0^2/4)\ln(v_{00}/v_{01}) +$$
$$(h^2 t_1^2/4)\ln(u_{11}/u_{01}) + (h^2 t_0^2/4)\ln(u_{00}/u_{10}) +$$
$$(h^4/16)\ln(v_{11}v_{00}/(v_{01}v_{10})) - (1/24)[t_1^3(r_{11}-r_{01}) + t_0^3(r_{00}-r_{10})] -$$
$$(1/8)[z_1^3(r_{11}-r_{10}) + z_0^3(r_{00}-r_{01})] -$$
$$(1/24)[z_1 t_1^2 r_{11} - z_1 t_0^2 r_{10} - z_0 t_1^2 r_{01} + z_0 t_0^2 r_{00}] +$$
$$(5/24)[z_1^2 t_1 r_{11} - z_1^2 t_0 r_{10} - z_0^2 t_1 r_{01} + z_0^2 t_0 r_{00}] +$$
$$(13/48)h^2[t_1(r_{11}-r_{01}) + t_0(r_{00}-r_{10})] +$$
$$(1/16)h^2[z_1(r_{11}-r_{10}) + z_0(r_{00}-r_{01})]$$

That is, it may be analytically found.

In this way, even if the two monopoles are parallel (cos $\phi=1$), the mutual impedances $Z_{11}$, $Z_{00}$, $Z_{01}$, and $Z_{10}$ between the monopoles shown in FIG. 4 can be calculated by elementary functions.

The above explanation may be summarized as follows:

That is, the routine 211 for calculation of the mutual impedance shown in FIG. 2 assumes that a triangle function current flows through the monopoles and approximates the exp(-jkr) contained in the equation for calculation of the mutual impedance between monopoles by a multiplication of exp(-jkr$_0$) and a Taylor expansion of exp[-jk(r-r$_0$)] to calculate the mutual impedance between monopoles.

The mutual impedance between monopoles derived at this time, when for example the exp(-jkr) is approximated by $$\exp(-jkr) \approx \exp(-jkr_0)[1 - jk(r-r_0) - k^2(r-r_0)^2/2 + jk^3(-r_0)^3/6]$$

(approximation case 3), becomes the following function:

$$Z_{11} = [(\mu/\varepsilon)^{1/2}/(4\pi d_1 d_2)]\exp(-jkr_0) \times$$
$$\int\int [-1 + (r_0/r) + k^2(\cos\phi(z-z_0)(t-t_0) - r_0\cos\phi(z-$$
$$z_0)(t-t_0)/r + r^2/6 - r_0 r/2 + r_0^2/2 - r_0^3/(6r)) +$$
$$k^4(\cos\phi(z-z_0)(t-t_0)r^2/6 - r_0\cos\phi(z-z_0)(t-t_0)r/2 +$$
$$(z-z_0)(t-t_0)\cos\phi r_0^2/2 - (z-z_0)(t-t_0)r_0^3\cos\phi/(6r)) -$$
$$j/(kr) + jk(\cos\phi(z-z_0)(t-t_0)/r + r/2 - r_0 + r_0^2/(2r)) +$$
$$jk^3(-\cos\phi(z-z_0)(t-t_0)r/2 + r_0\cos\phi(z-z_0)(t-t_0) -$$
$$r_0^2\cos\phi(z-z_0)(t-t_0)/(2r))] \cdot dz dt$$

The value of the function may be found analytically by elementary functions. Therefore, the routine 211 for calculation of the mutual impedance, unlike in the related art, can calculate the mutual impedance between monopoles by an analytical scheme. Note that the elementary function can also naturally be found by a numerical scheme.

Explaining this further, the mutual impedance between monopoles has a function expanded by a power of the wave number k, e.g.:

$$Z = e^{-jkr_0}[(a_0 + a_2 k^2 + a_4 k^4 + \ldots)$$
$$+ j(a_{-1}/k + a_1 k + a_3 k^3 + \ldots)]$$

Therefore, by substituting this equation by k having an imaginary part, it becomes possible to calculate the mutual impedance between monopoles located in a space having loss.

Next, the present invention will be explained in more detail with reference to an example of the flow of processing executed by the routine 211 for calculation of the mutual impedance shown in FIG. 5 to FIG. 7.

First, the flow of processing of FIG. 5 will be explained.

The routine 211 for calculation of the mutual impedance, as explained with reference to the flow of processing of FIG. 3, is started after the electronic apparatus to be analyzed is meshed into elements and also the frequency to be simulated is specified, for calculation of the mutual impedances between the mesh-like elements.

Figure 5:
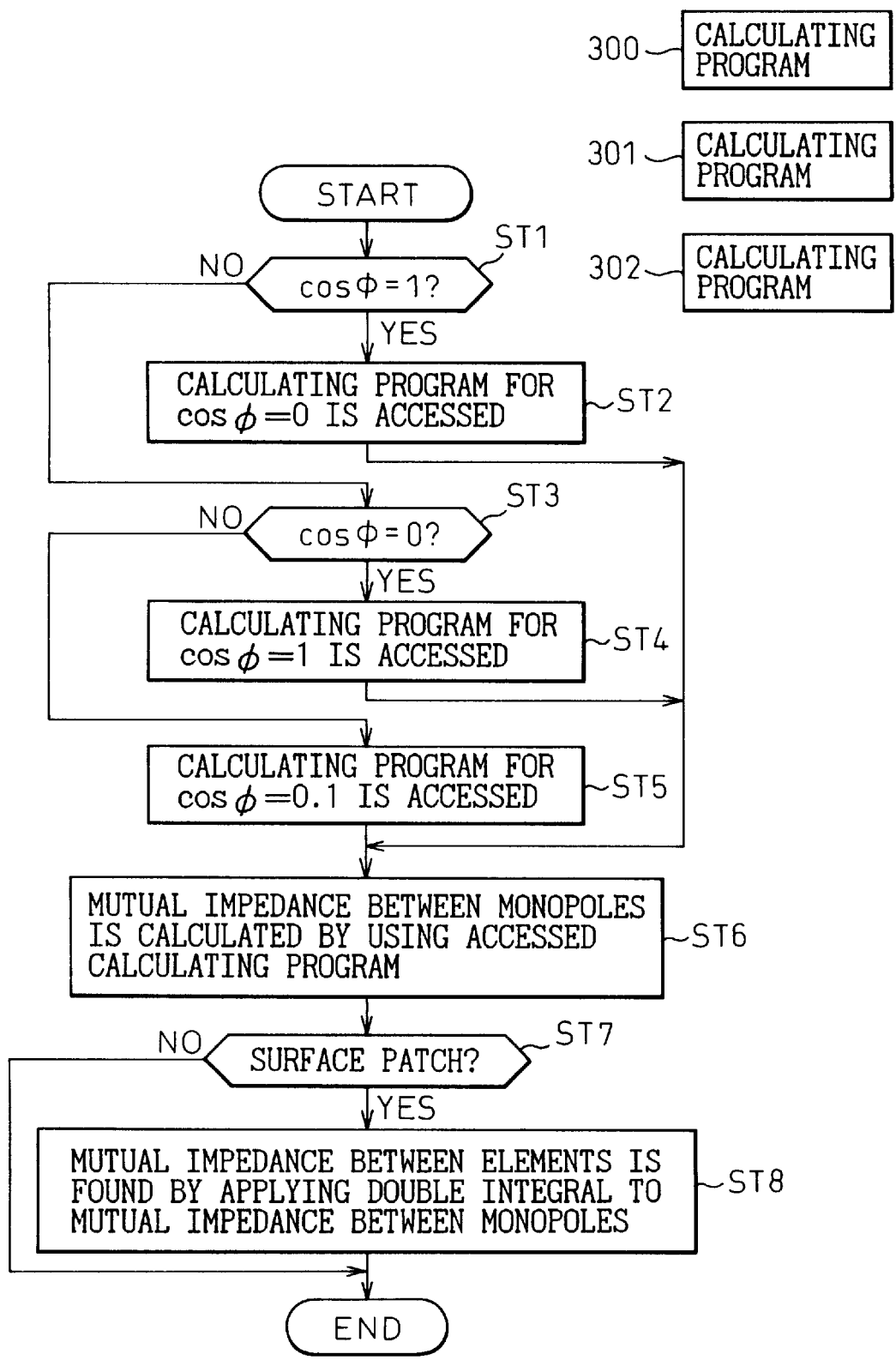
FIG. 5 is a flowchart of the processing for executing the routine for calculation of the mutual impedance.

When started up in this way, the routine 211 for calculation of the mutual impedance starts processing to successively select the mesh-like elements and calculate the mutual impedance between two selected elements in accordance with the flow of processing of FIG. 5 (for mutual impedance between wires, calculated by calculating the mutual impedance between monopoles as it is, while for the mutual impedance between surface patches, calculated by double integration of the mutual impedance between monopoles).

Here, in the flow of processing of FIG. 5, assuming for example approximation by approximation case 3, the routine 211 for calculation of the mutual impedance includes the following programs independently, i.e., calculation program 300 used for the processing for calculation of the mutual impedance between monopoles when the two monopoles are parallel (cos $\phi=1$), a calculation program 301 used for the processing for calculation of the mutual impedance between monopoles when the two monopoles are perpendicular to each other (cos $\phi=0$), and a calculation program 302 used for the processing for calculation of the mutual impedance between monopoles when the two monopoles are not parallel and are not perpendicular (cos $\phi \neq 1, 0$).

The calculation program 300 is a program prepared assuming that cos $\phi=1$ stands in the above-mentioned processing for calculation of the mutual impedance between monopoles and is comprised of much fewer steps than the calculation program 302 prepared assuming that cos $\phi \neq 1, 0$ stands. Further, the calculation program 301 is a program prepared assuming that cos $\phi=0$ stands in the above-mentioned processing for calculation of the mutual impedance between monopoles and is comprised of much fewer steps than the calculation program 302 prepared assuming that cos $\phi \neq 1, 0$ stands.

In the routine 211 for calculation of the mutual impedance, when the two mesh-like elements to be processed for calculation of the mutual impedance are selected, as shown in the flow of processing of FIG. 5, first, at step (ST1), the routine decides if the angle $\phi$ formed between the two selected elements, i.e., the monopoles, is the angle indicating the elements are parallel or not. When deciding that it indicates they are parallel, that is, when deciding that the angle $\phi$ formed between the two monopoles is 0 degree, the routine proceeds to step 2, where it accesses the calculation program 300 used when the two monopoles are parallel (cos $\phi=1$).

On the other hand, at step 1, when the routine decides that the angle $\phi$ formed between the two selected elements, i.e., the monopoles, indicates they are not parallel, the routine proceeds to step 3, where the routine decides if the angle $\phi$ formed between the two selected elements, i.e., the monopoles, indicates they are perpendicular to each other. When deciding that it indicates they are perpendicular to each other, that is, when deciding that the angle $\phi$ formed between the two monopoles is 90 degrees, the routine proceeds to step 4, where it accesses the calculation program 301 used when the two monopoles are perpendicular to each other (cos $\phi=0$).

On the other hand, when the routine decides at step 3 that the angle $\phi$ formed between the two selected elements, i.e., the monopoles, indicates they are not parallel and not perpendicular, that is, when deciding that the angle φ formed between the two selected elements, i.e., monopoles, indicates they are not parallel and not perpendicular, the routine proceeds to step 5, where it accesses the calculation program 302 used when the two monopoles are not parallel and not perpendicular (cos φ≠1, 0).

When the calculation programs 300, 301, and 302 used for the processing for calculation of the mutual impedance between monopoles at step 2, step 4, and step 5 are accessed, the routine proceeds to step 6, where it uses the accessed calculation programs 300, 301, and 302 to calculate the mutual impedance between monopoles.

The processing for calculation of the mutual impedance between monopoles finds the mutual impedance analytically by elementary functions as mentioned above, so can find the same much faster than the related art.

After calculating the mutual impedance between monopoles, the routine decides at step 7 if the two selected elements are surface patches. When deciding that they are surface patches, it proceeds to step 8, where it performs double integration on the calculated mutual impedance between monopoles to find the mutual impedance between the two selected elements and then ends the processing.

On the other hand, when the routine decides at step 7 that the two selected elements are not surface patches, that is, when it decides that the two selected elements are wires, the routine skips the processing of step 8 and uses the mutual impedance between monopoles calculated at step 6 as it is, to find the mutual impedance between the two selected elements and ends the processing.

Note that the mutual impedance between a wire and a surface patch is found by double integration deeming that the wire is a surface patch without a broad surface.

The routine 211 for calculation of the mutual impedance finds the mutual impedance between monopoles using elementary functions in this way so as to find the mutual impedance between mesh-like elements at a high speed.

Further, when following the flow of processing of FIG. 5, the following programs are prepared independently, i.e., a calculation program 300 used when the two monopoles are parallel (cos φ=1), a calculation program 301 used when the two monopoles are perpendicular to each other (cos φ=0), and a calculation program 302 used when the two monopoles are not parallel and are not perpendicular (cos φ≠1, 0) are separately prepared. When the two mesh-like elements are parallel, the calculation program 300 is used, when perpendicular, the calculation program 301 is used, and when not parallel and not perpendicular, the calculation program 302 is used to find the mutual impedance, so much higher speed calculation processing can be achieved.

Next, an explanation will be made of the flow of processing of FIG. 6.

Figure 6:
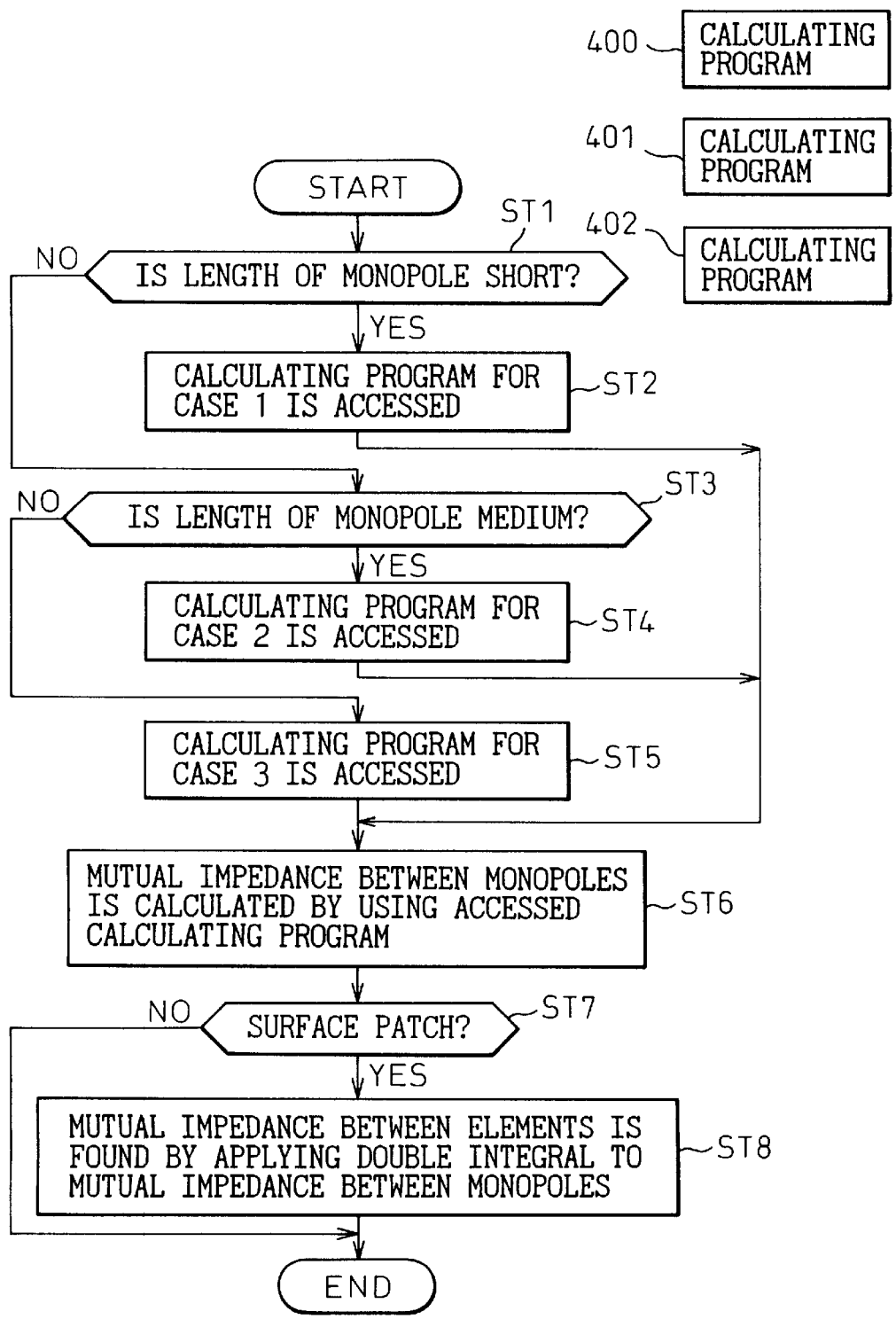
FIG. 6 is a flowchart of the processing for executing the routine for calculation of the mutual impedance.

Here, in the flow of processing of FIG. 6, the routine 211 for calculation of the mutual impedance includes the following programs, i.e., calculation program 400 for performing the processing for calculation of the mutual impedance between monopoles in accordance with approximation case 1 for approximating:

$$\exp(-jkr) \approx \exp(-jkr_0)[1-jk(r-r_0)]$$

a calculation program 401 for performing the processing for calculation of the mutual impedance between monopoles in accordance with approximation case 2 for approximating:

$$\exp(-jkr) \approx \exp(-jkr_0)[1-jk(r-r_0)-k^2(r-r_0)^2/2]$$

and a calculation program 402 for performing the processing for calculation of the mutual impedance between monopoles in accordance with approximation case 3 for approximating:

$$\exp(-jkr) \approx \exp(-jkr_0)[1-jk(r-r_0)-k^2(r-r_0)^2/2 30\ k^3(r-r_0)^3/6]$$

As will be understood from these approximation equations, the calculation program 400 is comprised of far fewer steps than the calculation programs 401 and 402. Further, the calculation program 401 is comprised of far fewer steps than the calculation program 402. Here, as explained with reference to the flow of processing of FIG. 5, the calculation programs 400, 401, and 402 are each preferably further comprised of a calculation program used when the two monopoles are parallel, a calculation program used when the two monopoles are perpendicular to each other, and a calculation program used when the two monopoles are not parallel and not perpendicular.

The routine 211 for calculation of the mutual impedance, in the case of following the flow of processing of FIG. 6, when the two mesh-like elements to be processed for calculation of the mutual impedance are selected, first, at step 1, decides if the lengths of the two selected elements, i.e., monopoles, are shorter than the wavelength (λ) of the specified frequency. When deciding that they are short monopoles with lengths equal to or less than 0.1 λ, it accesses the calculation program 400 for the approximation case 1, which can realize sufficient precision even with the rough approximation of $$\exp(-jkr) \approx \exp(-jkr_0)[1-jk(r-r_0)]$$

On the other hand, when deciding at step 1 that the lengths of the two selected elements, that is, monopoles, is not shorter than the wavelength of the specified frequency, the routine proceeds to step 3, where it decides if the lengths of the two selected elements, i.e., monopoles, are of medium extents compared with the wavelength (λ) of the specified frequency. When deciding that they are monopoles with medium extents of lengths having lengths of about 0.1 λ, it accesses the calculation program 401 for the approximation case 2 having a medium extent approximation level expressed by $$\exp(-jkr) \approx \exp(-jkr_0)[1-jk(r-r_0)-k^2(r-r_0)^2/2]$$

On the other hand, when deciding at step 3 that the lengths of the two selected elements, that is, monopoles, are not medium extents compared with the wavelength of the specified frequency, the routine proceeds to step 4, where it accesses the calculation program 402 for the approximation case 3 having a high precision approximation level expressed by $$\exp(-jkr) \approx \exp(-jkr_0)[1-jk(r-r_0)-k^2(r-r_0)^2/2 30\ k^3(r-r_0)^3/6]$$

When accessing the calculation programs 400, 401, and 402 used for the processing for calculation of the mutual impedance between monopoles at step 2, step 4, or step 5, the routine proceeds to step 6, where it uses the accessed calculation programs 400, 401, and 402 to calculate the mutual impedance between monopoles.

The processing for calculation of the mutual impedance between monopoles is performed analytically using elementary functions as explained above, so can be performed at an extremely high speed compared with the related art.

After calculating the mutual impedance between monopoles, next, at step 7, the routine decides if the two selected elements are surface patches or not. When deciding that they are surface patches, it proceeds to step 8, where it performs double integration on the calculated mutual impedance between monopoles to find the mutual impedance between the two selected elements and then ends the processing.

On the other hand, when the routine decides at step 7 that the two selected elements are not surface patches, that is, when it decides that the two selected elements are wires, the routine skips the processing of step 8 and uses the mutual impedance between monopoles calculated at step 6 as it is, to find the mutual impedance between the two selected elements and ends the processing.

The routine 211 for calculation of the mutual impedance finds the mutual impedance between monopoles using elementary functions in this way so as to find the mutual impedance between mesh-like elements at a high speed.

Further, when following the flow of processing of FIG. 6, the following programs are included independently, i.e., a calculation program 400 for approximation case 1 used when the lengths of the monopoles are short, a calculation program 401 for approximation case 2 used when the lengths of the monopoles are of medium extents, and a calculation program 402 for approximation case 3 used when the lengths of the monopoles are long are separately prepared. When the lengths of the mesh-like elements are shorter than the wavelength of the specified frequency, the calculation program 400 is used, when of a medium extent, the calculation program 401 is used, and when long, the calculation program 402 is used to find the mutual impedance, so much higher speed calculation processing can be achieved.

Next, an explanation will be made of the flow of processing of FIG. 7.

Figure 7:
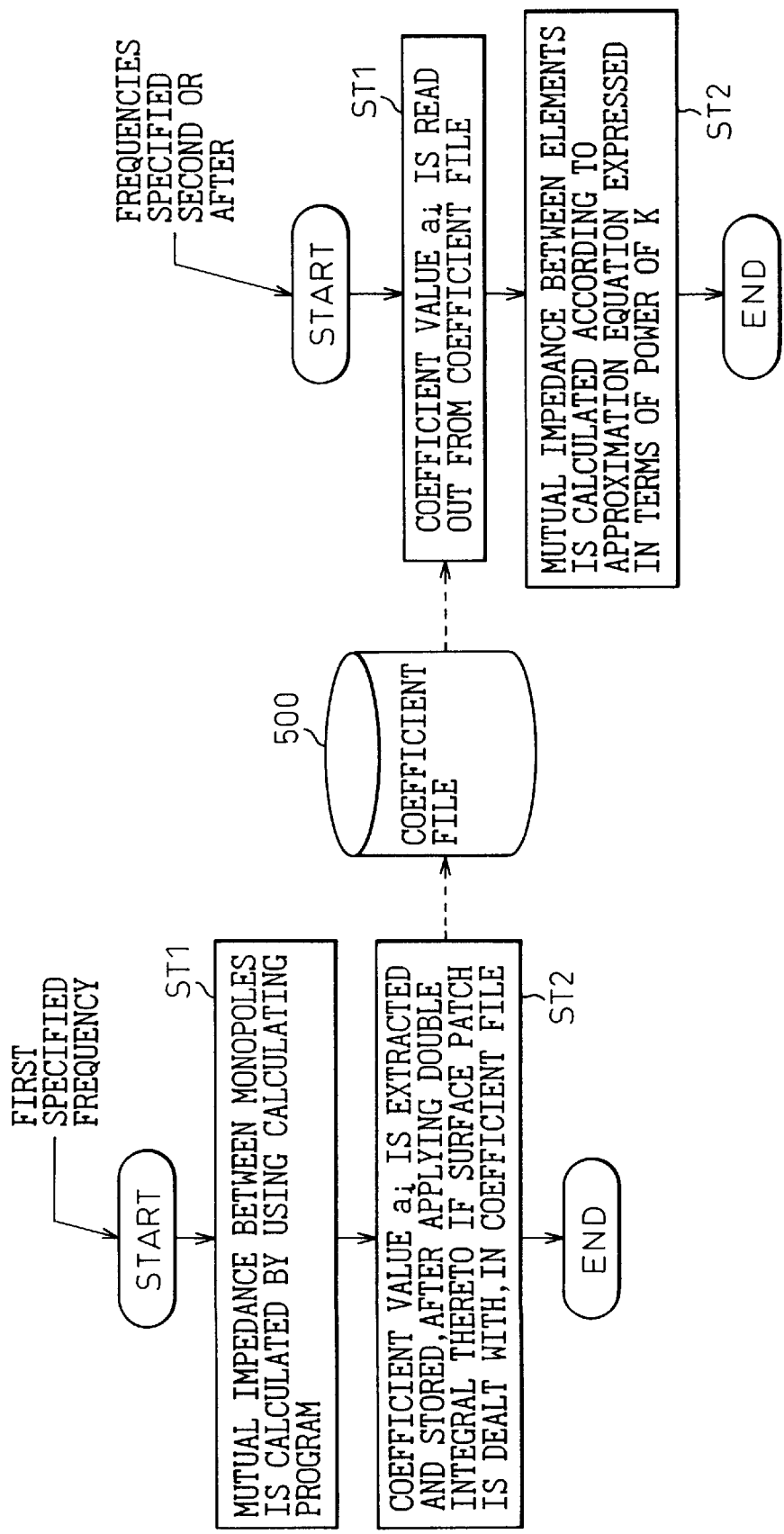
FIG. 7 is a flowchart of the processing for executing the routine for calculation of the mutual impedance.

The routine 211 for calculation of the mutual impedance, in the case of following this flow of processing, when the first frequency is specified, as shown in the flow of processing on the left side of FIG. 7, first, at step (ST) 1, selects the two mesh-like elements to be processed for calculation of the mutual impedance, then uses the above calculation programs 300, 301, and 302 and the calculation programs 400, 401, and 402 to calculate the mutual impedance between the two selected elements, that is, monopoles.

The mutual impedance between monopoles calculated at this time, as explained above, has a function expanded by a power of the wave number k, expressed by $$Z = e^{-jkr0}[(a_0 + a_2 k^2 + a_4 k^4 + \ldots)$$
$$+ j(a_{-1}/k + a_1 k + a_3 k^3 + \ldots)]$$

Next, at step 2, it extracts the coefficient value $a_i$ of the function expressed by a power of the wave number k in accordance with the calculated mutual impedance between monopoles. When the selected elements are surface patches, it performs double integration on the coefficient value $a_i$. Further, when the selected elements are wires, it stores the extracted coefficient value $a_i$ in the coefficient file 500, while when the selected elements are surface patches, stores the double integral of the coefficient value $a_i$ in the coefficient file 500.

In this way, the coefficient file 500 stores either the coefficient value $a_i$ corresponding to the two mesh-like elements or double integral of the value $a_i$.

On the other hand, when the second and later frequencies are specified, the routine 211 for calculation of the mutual impedance first, at step 1, as shown in the flow of processing on the right side of FIG. 7, selects the two mesh-like elements to be processed for calculation of the mutual impedance and reads the coefficient value $a_i$ corresponding to those two elements (or double integral value of $a_i$) from the coefficient file 500.

Next, at step 2, it substitutes the read coefficient value $a_i$ (or double integral vlaue of $a_i$) and the wave number (k) indicated by the specified frequency into $$Z = e^{-jkr0}[(a_0 + a_2 k^2 + a_4 k^4 + \ldots)$$
$$+ j(a_{-1}/k + a_1 k + a_3 k^3 + \ldots)]$$

to calculate the mutual impedance between the two mesh-like elements selected at the second and later frequencies.

In this way, in the case of following the flow of processing of FIG. 7, when the first frequency is specified, the routine 211 for calculation of the mutual impedance calculates the mutual impedance between mesh-like elements at that frequency, between wires, to find the coefficient value $a_i$ of $$Z = e^{-jkr0}[(a_0 + a_2 k^2 + a_4 k^4 + \ldots)$$
$$+ j(a_{-1}/k + a_1 k + a_3 k^3 + \ldots)]$$

and, between surface patches, to find the double integral of the coefficient value $a_i$ as follows:

$$Z = e^{-jkr0}[(\int\int a_0 dvde + k^2 \int\int a_2 dvde + k^4 \int\int a_4 dvde + \ldots)$$
$$+ j(1/k) \int\int a_{-1} dvde + k \int\int a_1 dvde + k^3 \int\int a_3 dvde + \ldots)]$$

For the second and later frequencies, it substitutes the wave number (k) of the frequency into the above approximation equation Z to calculate the mutual impedance between elements.

The routine 211 for calculation of the mutual impedance can find the mutual impedance between mesh-like elements much faster in accordance with this calculation processing.

This method of calculation of the mutual impedance is effective even when the wave number (k) changes but when the coefficient value $a_i$ and/or its double integral value do not change. This condition stands when the lengths of the monopoles are shorter than the wavelength of the specified frequency.

As explained above, the simulation apparatus of the present invention is configured to calculate the mutual impedances between segmented elements of an electronic apparatus at a specified frequency and simulate the current flowing through the elements by the moment method from the mutual impedances and the wavesource of the elements. It is possible to calculate the mutual impedances between elements at a high speed by elementary functions, so it is possible to simulate the current flowing through the elements at a high speed.

Further, since it is configured so as to calculate the mutual impedance between elements while maintaining both the symmetry of the mutual impedance between elements and the reaction matching, it is possible to simulate the current flowing through the elements at a high speed while maintaining the advantageous features of the related art.

What is claimed is:

1. A simulation apparatus for simulating current flowing through elements of an electronic apparatus using a moment method based on reaction matching, comprising:

segmenting means for segmenting the electronic apparatus to be analyzed into elements in accordance with configuration information of the electronic apparatus;

calculating means for calculating a mutual impedance between elements, segmented by the segmenting means, of the electronic apparatus, assuming that a triangle function current flows through monopoles, by using an approximation equation of a mutual impedance between monopoles, equation of the mutual impedance between monopoles, expressed by a polynomial of the power of k, derived by exp(–jkr) which is approximated by mutliplication of $\exp(-jkr_0)$ and a Taylor expansion of $\exp[-jk(r-r_0)]$ (where j is an imaginary number, k is a wave number, r is the distance between monopoles, and $r_0$ is a representative distance between monopoles); and simulating means, using the mutual impedances between elements calculated by the calculating means, for finding the current flowing through the elements, segmented by the segmenting means, of the electronic apparatus in accordance with the moment method.

2. A simulation apparatus as set forth in claim 1, wherein said calculating means calculates the mutual impedance between elements in accordance with an analytical scheme.

3. A simulation apparatus as set forth in claim 1, wherein said calculating means calculates the mutual impedance between elements in a space with loss by substituting k, having an imaginary number portion, into an approximation equation of the mutual impedance between monopoles expressed by a polynomial of a power of k.

4. A simulation apparatus as set forth in claim 1, wherein said calculating means, individually including a first calculation processing routine used when two monopoles are parallel, a second calculation processing routine used when two monopoles are perpendicular to each other, and a third calculation processing routine used when two monopoles are not parallel and not perpendicular, calculates the mutual impedance between elements by using one of the calculation processing routines out of the first to third calculation processing routines in accordance with the angle formed by the two monopoles.

5. A simulation apparatus as set forth in claim 1, wherein said calculating means, individually including a plurality of calculation processing routines with different expansion levels of a Taylor expansion of $\exp[-jk(r-r_0)]$, calculates the mutual impedance between elements by using one of the calculation processing routines in accordance with respective lengths of the monopoles.

6. A simulation apparatus as set forth in claim 1, further comprising:

memory means for storing coefficient values calculated by said calculating means, that is, coefficient values of the power of k in the approximation equation of the mutual impedance between elements at a specified frequency; and said calculating means calculates the mutual impedances between elements at frequencies other than the specified frequency by using the coefficient values stored in the memory means.

7. A simulation apparatus as set forth in claim 5, further comprising:

memory means for storing coefficient values calculated by said calculating means, that is, coefficient values of the power of k in the approximation equation of the mutual impedance between elements at a specified frequency; and said calculating means calculates the mutual impedances between elements at frequencies other than the specified frequency by using the coefficient values stored in the memory means.

8. A simulation apparatus as set forth in claim 4, further comprising:

memory means for storing coefficient values calculated by said calculating means, that is, coefficient values of the power of k in the approximation equation of the mutual impedance between elements at a specified frequency; and said calculating means calculates the mutual impedances between elements at frequencies other than the specified frequency by using the coefficient values stored in the memory means.

9. A simulation apparatus as set forth in claim 2, further comprising:

memory means for storing coefficient values calculated by said calculating means, that is, coefficient values of the power of k in the approximation equation of the mutual impedance between elements at a specified frequency; and said calculating means calculates the mutual impedances between elements at frequencies other than the specified frequency by using the coefficient values stored in the memory means.

10. A simulation apparatus as set forth in claim 3, further comprising:

memory means for storing coefficient values calculated by said calculating means, that is, coefficient values of the power of k in the approximation equation of the mutual impedance between elements at a specified frequency; and said calculating means calculates the mutual impedances between elements at frequencies other than the specified frequency by using the coefficient values stored in the memory means.

11. A simulation apparatus as set forth in claim 1, further comprising:

memory means for storing double integrals of coefficient values calculated by said calculating means, that is, coefficient values of the power of k in the approximation equation of the mutual impedance between elements at a specified frequency; and said calculating means calculates the mutual impedances between elements at frequencies other than the above specified frequency by using the double integrals of the coefficient values stored in the memory means.

12. A simulation apparatus as set forth in claim 5, further comprising:

memory means for storing double integrals of coefficient values calculated by said calculating means, that is, coefficient values of the power of k in the approximation equation of the mutual impedance between elements at a specified frequency; and said calculating means calculates the mutual impedances between elements at frequencies other than the above specified frequency by using the double integrals of the coefficient values stored in the memory means.

13. A simulation apparatus as set forth in claim 4, further comprising:

memory means for storing double integrals of coefficient values calculated by said calculating means, that is, coefficient values of the power of k in the approximation equation of the mutual impedance between elements at a specified frequency; and said calculating means calculates the mutual impedances between elements at frequencies other than the above specified frequency by using the double integrals of the coefficient values stored in the memory means.

14. A simulation apparatus as set forth in claim 2, further comprising:

memory means for storing double integrals of coefficient values calculated by said calculating means, that is, coefficient values of the power of k in the approximation equation of the mutual impedance between elements at a specified frequency; and said calculating means calculates the mutual impedances between elements at frequencies other than the above specified frequency by using the double integrals of the coefficient values stored in the memory means.

15. A simulation apparatus as set forth in claim 3, further comprising:

memory means for storing double integrals of coefficient values calculated by said calculating means, that is, coefficient values of the power of k in the approximation equation of the mutual impedance between elements at a specified frequency; and said calculating means calculates the mutual impedances between elements at frequencies other than the specified frequency by using the double integrals of the coefficient values stored in the memory means.

16. A simulation method for simulating the current flowing through elements of an electronic apparatus using a moment method based on reaction matching, comprising:

a first processing step of segmenting the electronic apparatus to be analyzed into elements in accordance with configuration information of the electronic apparatus;

a second processing step of calculating a mutual impedance between elements, segmented by said first processing step, of the electronic apparatus, assuming that a triangle function current flows through monopoles, by using an approximation equation of the mutual impedance between monopoles, expressed by a polynomial of the power of k, derived by $\exp(-jkr)$ which is approximated by multiplication of $\exp(-jkr_0)$ and a Taylor expansion of $\exp[-jk(r-r_0)]$ (where j is an imaginary number, k is a wave number, r is the distance between monopoles, and $r_0$ is a representative distance between monopoles); and a third processing step, using the mutual impedances between elements calculated by said second processing step, to find the current flowing through the elements, segmented by said first processing step, of the electronic apparatus in accordance with the moment method.

17. A memory medium storing programs used for realization of a simulation apparatus simulating current flowing through elements of an electronic apparatus using a moment method based on reaction matching and comprising:

segmenting means for segmenting the electronic apparatus to be analyzed into elements in accordance with configuration information of the electronic apparatus;

calculating means for calculating a mutual impedance between elements, segmented by the segmenting means, of the electronic apparatus, assuming that a triangle function current flows through monopoles, by using an approximation equation of a polynomial of the power of k, derived by $\exp(-jkr)$ which is approximated by multiplication of $\exp(-jkr_0)$ and a Taylor expansion of $\exp[-jk(r-r_0)]$ (where j is an imaginary number, k is a wave number, r is the distance between monopoles, and $r_0$ is a representative distance between monopoles); and simulating means, using the mutual impedances between elements calculated by the calculating means, for finding the current flowing through the elements, segmented by the segmenting means, of the electronic apparatus in accordance with the moment method.

* * * * *